United States Patent
Wang et al.

(10) Patent No.: US 12,230,470 B2
(45) Date of Patent: Feb. 18, 2025

(54) CHARGED PARTICLE DETECTOR WITH GAIN ELEMENT

(71) Applicant: ASML Netherlands B.V., Veldhoven (NL)

(72) Inventors: Yongxin Wang, San Ramon, CA (US); Rui-Ling Lai, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 742 days.

(21) Appl. No.: 16/800,946

(22) Filed: Feb. 25, 2020

(65) Prior Publication Data
US 2020/0273664 A1 Aug. 27, 2020

Related U.S. Application Data

(60) Provisional application No. 62/810,905, filed on Feb. 26, 2019.

(51) Int. Cl.
*H01J 37/244* (2006.01)
*H01L 27/144* (2006.01)
(Continued)

(52) U.S. Cl.
CPC ........ *H01J 37/244* (2013.01); *H01L 27/1443* (2013.01); *H01L 27/14658* (2013.01);
(Continued)

(58) Field of Classification Search
CPC ........... H01L 27/1443; H01L 27/14612; H01L 27/14681; H01J 37/244
See application file for complete search history.

(56) References Cited

U.S. PATENT DOCUMENTS 4,670,765 A * 6/1987 Nakamura ........ H01L 27/14665
327/515
4,933,731 A * 6/1990 Kimura ............. H01L 27/14643
257/292
(Continued)

FOREIGN PATENT DOCUMENTS

CN 102169918 B * 5/2013
JP 2007-527500 A 9/2007
(Continued)

OTHER PUBLICATIONS

Huang et al., "High current gain 4H—SiC NPN bipolar junction transistors", IEEE Electron Device Letters, vol. 24, No. 6, p. 396-398, Jun. 2003 (Year: 2003).*
(Continued)

*Primary Examiner* — Zandra V Smith
*Assistant Examiner* — Woo K Lee
(74) *Attorney, Agent, or Firm* — Finnegan, Henderson, Farabow, Garrett & Dunner, LLP

(57) ABSTRACT

A detector may be provided with a sensing element or an array of sensing elements, each of the sensing elements may have a corresponding gain element. A substrate may be provided having a sensing element and a gain element integrated together. The gain element may include a section in which, along a direction perpendicular to an incidence direction of an electron beam, a region of first conductivity is provided adjacent to a region of second conductivity, and a region of third conductivity may be provided adjacent to the region of second conductivity. The sensing element may include a section in which, along the incidence direction, a region of fourth conductivity is provided adjacent to an intrinsic region of the substrate, and the region of second conductivity may be provided adjacent to the intrinsic region.

15 Claims, 15 Drawing Sheets

(51) Int. Cl.
*H01L 27/146* (2006.01)
*H01L 31/115* (2006.01)
*H01L 31/18* (2006.01)

(52) U.S. Cl.
CPC ............ *H01L 31/115* (2013.01); *H01L 31/18* (2013.01); *H01J 2237/2441* (2013.01); *H01J 2237/2448* (2013.01)

(56) References Cited

U.S. PATENT DOCUMENTS

| | | | | |
|---|---|---|---|---|
| 5,254,480 | A | * | 10/1993 | Tran ................ H01L 27/14663 250/370.09 |
| 5,420,452 | A | * | 5/1995 | Tran ................ H01L 27/14663 257/444 |
| 8,796,608 | B2 | * | 8/2014 | Lee ...................... H04N 25/77 348/301 |
| 2005/0133838 | A1 | | 6/2005 | Son et al. |
| 2006/0278943 | A1 | * | 12/2006 | Turchetta .......... H01L 27/14601 257/431 |
| 2011/0204246 | A1 | * | 8/2011 | Tanaka ................ H04N 25/76 250/370.08 |
| 2012/0211660 | A1 | * | 8/2012 | Allee ...................... G01T 3/06 250/361 R |
| 2015/0263058 | A1 | | 9/2015 | Konstantin |
| 2017/0110492 | A1 | * | 4/2017 | Gordon ................ H01L 31/118 |
| 2018/0108702 | A1 | * | 4/2018 | Cao .................. H01L 27/14659 |
| 2018/0329084 | A1 | * | 11/2018 | Karim .................... G01T 1/247 |
| 2020/0335653 | A1 | * | 10/2020 | Cao ..................... G01N 23/046 |

FOREIGN PATENT DOCUMENTS

| | | | |
|---|---|---|---|
| JP | 2011-145292 A | 7/2011 | |
| TW | 201621963 A | 6/2016 | |
| TW | 201940871 A | 10/2019 | |
| TW | 202001972 A | 1/2020 | |
| TW | I754230 B | 2/2022 | |
| WO | WO-2006018470 A1 * | 2/2006 | ....... H01L 27/14603 |

OTHER PUBLICATIONS

Notice of Reasons for Rejection from the Japan Patent Office issued in related Japanese Patent Application No. 2021-545711; mailed Aug. 25, 2022 (7 pgs.).

Notification of Reason(s) for Refusal from the Korean Patent Office issued in related Korean Patent Application No. 10-2021-7027286; mailed Jun. 30, 2023 (5 pgs.).

Wermes, Norbert, "Pixel Detectors for Charged Particles," Preprint submitted to Elsevier, arXiv:0811.4577v1 [physics.ins-det] Nov. 27, 2008 (19 pgs.).

Partial International Search Report issued by the International Searching Authority in related PCT International Application No. PCT/EP2020/053059 (1 pg.).

Office Action of the Intellectual Property Office of Taiwan issued in related Taiwanese Patent Application No. 109105795; mailed Dec. 25, 2020 (13 pgs.).

* cited by examiner

S106

S107

S108

S109

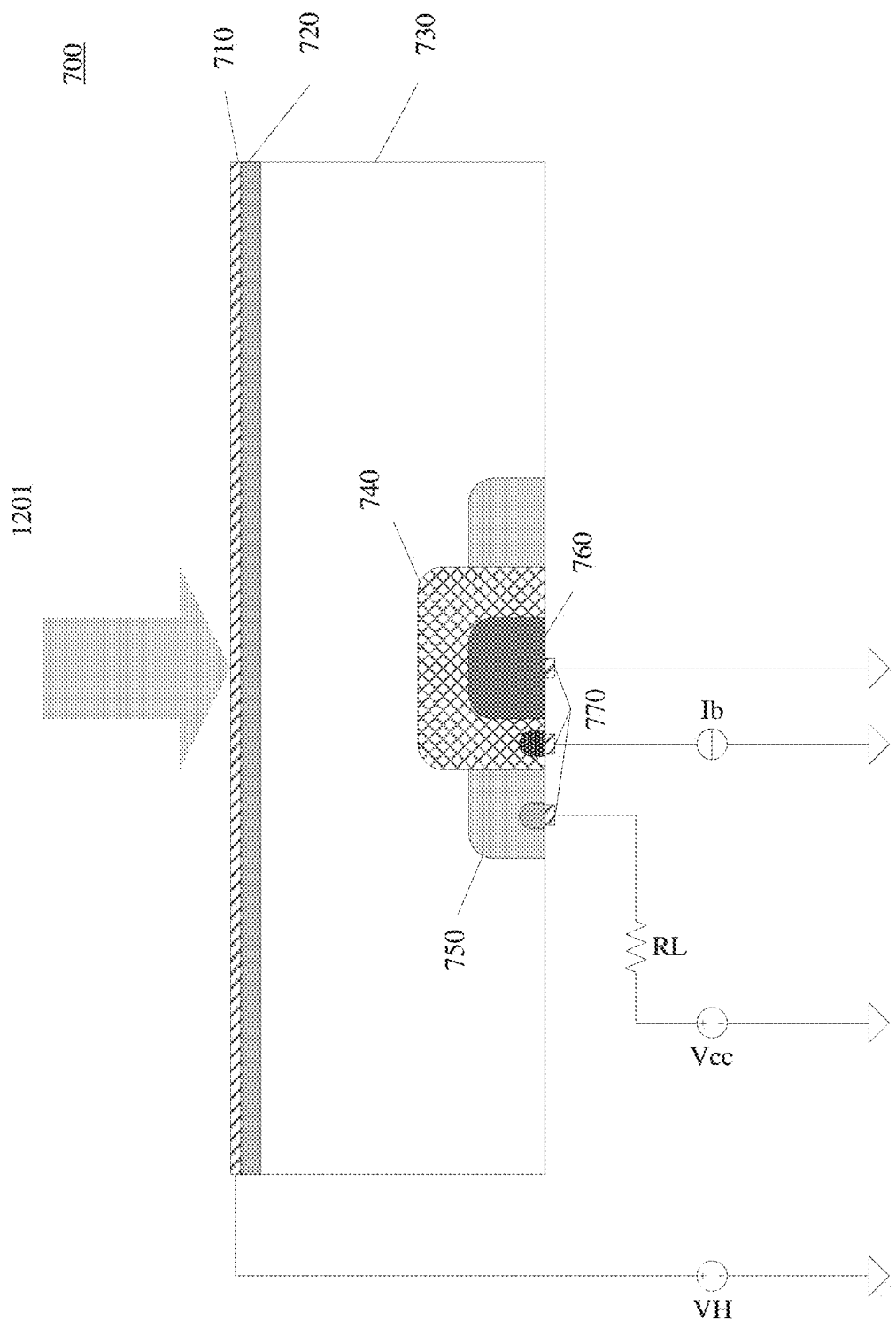

CHARGED PARTICLE DETECTOR WITH GAIN ELEMENT

CROSS-REFERENCE TO RELATED APPLICATIONS

This application claims priority of U.S. application 62/810,905 which was filed on Feb. 26, 2019, and which is incorporated herein in its entirety by reference.

FIELD

The description herein relates to charged particle detection, and more particularly, to systems and methods that may be applicable to charged particle beam detection.

BACKGROUND

Detectors may be used for sensing physically observable phenomena. For example, charged particle beam tools, such as electron microscopes, may comprise detectors that receive charged particles projected from a sample and that output a detection signal. Detection signals can be used to reconstruct images of sample structures under inspection and may be used, for example, to reveal defects in the sample. Detection of defects in a sample is increasingly important in the manufacturing of semiconductor devices, which may include large numbers of densely packed, miniaturized integrated circuit (IC) components. Dedicated inspection tools may be provided for this purpose.

In some applications in the field of inspection, for example microscopy using a scanning electron microscope (SEM), an electron beam may be scanned across a sample to derive information from backscattered or secondary electrons generated from the sample. In a related art, electron detection systems in SEM tools may include a detector configured to detect electrons coming from the sample. In some applications, detection signal may be very weak when low beam current is used or when energy level of electrons is low, and thus, sensitivity becomes an issue. Some detectors may be configured to add current gain in a detection signal to bring the level of signal up to a measurable amount. However, providing a conventional gain element, such as an external amplifier, to a detector may complicate the system and may also introduce noise. Addition of noise may contribute to reduction in signal-to-noise ratio (SNR) in the overall system and may degrade the quality of imaging.

In a comparative example, a detection device may be equipped with a scintillator, which may emit light in response to receiving electrons. The intensity of an incoming electron beam may first be converted into an optical signal by the scintillator. Then, the optical signal may be guided to a photo-detector through an optical path. Upon reaching the photo-detector, a corresponding electrical signal may be generated. The generated signal may have an amplitude that represents the intensity of the incoming electron beam.

Systems employing a scintillator may have the following drawbacks. For example, noise may be introduced clue to the conversion between electron intensity to optical signal in the scintillator, and conversion of optical signal to electrical signal in the photo-detector. Furthermore, connections between various components, like the scintillator and light guide, may each contribute to noise and signal loss. Losses may include a coupling loss between the scintillator and optical path, insertion loss of the optical path, and coupling loss between the optical path and the photo-detector.

In another type of detection device, a PIN diode may be used. A PIN diode may include a semiconductor structure with multiple regions of differing conductivity, for example p-type semiconductor regions and n-type semiconductor regions, separated by an intrinsic region. The PIN diode may generate an electrical signal in response to receiving electrons. The intensity of an incoming electron beam may be directly converted to an electrical signal. Compared to a system using a scintillator, a system using a PIN diode may have less noise due to signal type conversion and couplings. This may improve overall SNR of a SEM system.

Furthermore, PIN diodes may have inherent internal gain due to energy multiplication based on an ionization effect from incoming electrons. Built-in gain of a PIN diode may be commensurate with the energy of an incident particle. For example, the higher the energy of incoming electrons, the higher the gain of the device. Conversely, when energy of incoming electrons is small, associated gain may be low. Therefore, to detect particles when their energy is low, it may be necessary to add gain by, for example, attaching an amplifier. However, as noted above, connecting an amplifier downstream of a sensing element in a detection system may cause deterioration of signal-to-noise ratio. Reduction of SNR may be partly due to external interconnection between the sensing element and the amplifier. Accordingly, a limitation of PIN diodes may be that the built-in gain for low-energy particles may not be sufficient to actually improve SNR for broad ranges of uses.

In further comparative detection systems, a detector may include a built-in gain element comprising a structure similar to a PIN diode that is used for amplification. The PIN diode may be biased to avalanche mode or Geiger counting mode by applying high enough reverse bias voltage. Internal gain may be achieved by high internal electric field induced ionization. While such a detection system may have high built-in gain, it may suffer from high internal noise and high temperature coefficient of gain.

SUMMARY

Embodiments of the present disclosure provide systems and methods relevant to charged particle detection. In some embodiments, a detector may be provided having a built-in gain block. The detector may be used in a charged particle beam apparatus.

A detector for a charged particle beam apparatus may include a sensing element and a gain element provided in a substrate. The sensing element and the gain element may be aligned in a first direction. The first direction may be parallel with an incidence direction of a beam of charged particles impinging on the detector, which may correspond with the thickness direction of the substrate. The gain element may include a section in which, along a second direction perpendicular to the first direction, a region of first conductivity is provided adjacent to a region of second conductivity, and a region of third conductivity is provided adjacent to the region of second conductivity. The first conductivity may be n+ semiconductor, the second conductivity may be p+ semiconductor, and the third conductivity may be n+++ semiconductor. The region of second conductivity may be interposed between the region of first conductivity and the region of third conductivity.

The sensing element may include a first layer including a region of fourth conductivity. The sensing element may include a section in which, along the first direction, the region of fourth conductivity is provided adjacent to an intrinsic region, and the region of second conductivity is provide adjacent to the intrinsic region.

In some embodiments, a substrate may be provided in a layer structure. The substrate may include a first layer including a first region of a first conductivity, a second layer including a second region of a second conductivity, a third layer including a third region of a third conductivity interposed between a fourth region of the second conductivity, and a fourth layer including a fifth region of a fourth conductivity type interposed between a sixth region of the third conductivity, the sixth region being interposed between a seventh region of a fifth conductivity, the seventh region being interposed between an eighth region of the second conductivity. The first through fourth layers may be stacked in a thickness direction of the substrate.

In some embodiments, the method may include forming a sensing element in a substrate, and forming a gain element in the substrate. The method may include semiconductor doping. Forming the gain element may include implanting the region of second conductivity into the region of first conductivity to a depth greater than a depth of the region of first conductivity such that the region of second conductivity protrudes into the intrinsic region of the substrate.

According to some embodiments, a detector may be provided with a built-in gain block that may have adjustable gain. A low-noise gain block may be embedded directly into a detector so that noise contribution from an external amplifier and its associated inter-connections may become insignificant. Therefore, overall signal-to-noise ratio (SNR) of a detection system may be improved. Output of a sensing element may be fed directly into the gain block. The gain block may be made in an array arrangement, which may improve speed, overall reliability, device robustness, device uniformity, or heat dissipation. Functions of a sensing element and a gain element (such as a built-in gain block) may be separated while their structures are merged in a substrate. This may allow optimization of respective functions while achieving a structure that is advantageous from the perspective of, for example, high SNR, durability, and simplified system design. Some embodiments may be effective in applications where incoming charged particle energy is low, beam current is low, or when using charged particle counting. For example, when electron beam current in a SEM device is low, even when incoming electron energy is high, embodiments of the disclosure may be useful for, e.g., improving SNR. Additional situations may include when electron beam current is high while incoming electron energy is low, and when electron beam current is low and incoming electron energy is low. In such situations, signal output from sensing elements of a detector may be weak, and thus, embodiments of the disclosure may be useful.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the disclosure. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings in which:

FIG. 12 illustrates a schematic of forming electrical connections with a substrate, consistent with embodiments of the present disclosure.

DETAILED DESCRIPTION OF THE DRAWINGS

Figure 1:
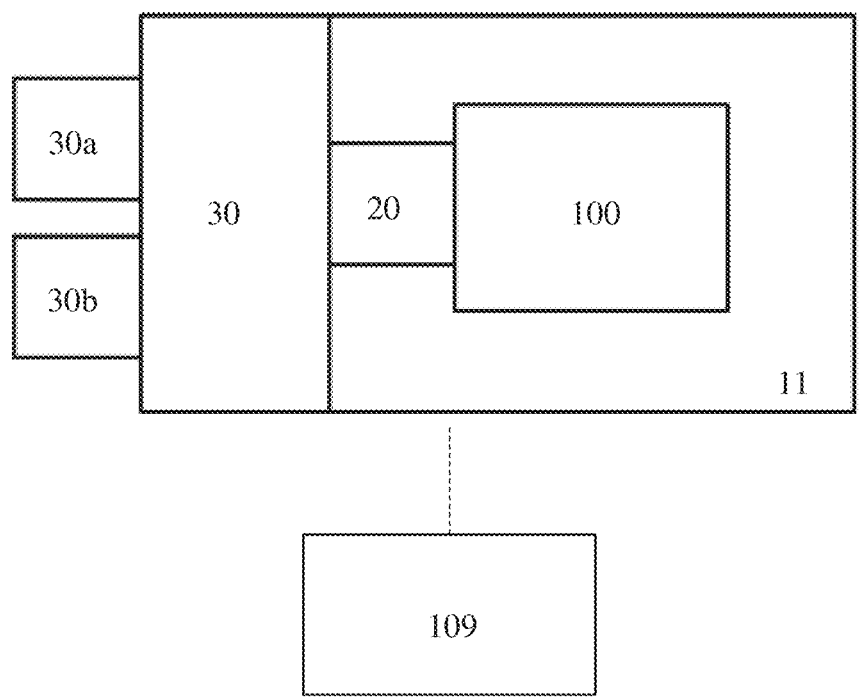
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Aspects of the present application relate to systems and methods for charged particle beam detection. Detectors may be configured to detect charged particles, such as electrons, and may be useful in an inspection tool, such as a scanning electron microscope (SEM) Inspection tools may be used in the manufacturing process of integrated circuit (IC) components. To realize the enhanced computing power of modern-day electronic devices, the physical size of the devices may shrink while the packing density of circuit components, such as, transistors, capacitors, diodes, etc., is significantly increased on an IC chip. For example, in a smartphone, an IC chip (which may be the size of a thumbnail) may include over 2 billion transistors, the size of each transistor being less than 1/1000th of the width of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

It is increasingly important to ensure the ability to detect defects with high accuracy and high resolution while maintaining high throughput (defined as the number of wafers processed per hour, for example). High process yields and high wafer throughput may be impacted by the presence of defects, especially when operator intervention is involved. Thus, detection and identification of micrometer and nanometer-sized defects by inspection tools (such as a SEM) is important for maintaining high yields and low cost.

In some inspection tools, a sample may be inspected by scanning a beam of high energy electrons over the sample surface. Due to interactions at the sample surface, secondary electrons may be generated from the sample that are then detected by a detector. In some applications, the detector may be in the form of a PIN diode, where the intensity of the incoming beam of secondary electrons may be converted to an electrical signal. However, in some situations, the energy of electrons landing on the detector may be relatively low, and thus, the signal from the sensing elements may be correspondingly weak and may be difficult to detect.

Related detection systems may have limitations, for example and as discussed above, low sensitivity and poor signal-to-noise ratio (SNR). Aspects of the present disclosure may address some such limitations by providing a detector with a built-in gain element. The built-in gain element may reduce or eliminate the need for providing an additional external amplification stage and associated connections. This may prevent signal loss and noise introduction by reducing or shortening couplings between the detector and external structures.

In situations where the incoming charged particle beam intensity on a detector is low, such as when the number of electrons landing on the detector is small or the energy level of individual incident electrons is low, it may be difficult to generate an electrical current from a sensing element of a detector. An output signal from the detector may be so weak that additional amplification may be necessary to measure any signal. Therefore, some detectors may use amplification methods or gain elements, such as avalanche multiplication. Some gain elements may be provided in separate stages, and may be provided as separate, discrete structures. For example, an avalanche diode may be connected downstream of a sensing element. However, providing numerous components, each of which may have intermediary connections, is not ideal because each connection may introduce noise. Furthermore, wires themselves may contribute to electromagnetic interference as electrical current runs through them, acting like an antenna. This may disturb nearby electrical components.

In aspects of the disclosure, a detector may be provided with a sensing element and a gain element integrated together. The sensing element may provide the function of generating a signal in response to charged particles being received on the detector, and the gain element may provide the function of adding gain to the signal. The gain element may be built-in to the structure making up the sensing element, such as a semiconductor substrate.

The built-in gain element may include a bipolar junction transistor (BJT). The gain element may be incorporated in the detector by implanting dopant species in a semiconductor substrate to form areas of differing semiconductor conductivity. The gain element may form an integrated structure with the detector. Therefore, the gain element may be provided together with the detector as a single (e.g., monolithic) unit and may reduce the need to provide external structures, such as numerous separate amplifiers and wirings to connect them.

A BJT may be useful as a gain element for a number of reasons. For example, the amount of gain may be accurately controlled. Thus, a gain element may have adjustable gain, which may be useful in enhancing the dynamic range of the detector. In some applications, the incoming electron signal may range from very high to very low, and a detector should be able to apply an appropriate amount of gain and detect them accordingly. Furthermore, the amount of voltage applied to a BJT to produce a substantial amount of gain may be relatively low compared to the voltage applied to an avalanche diode that may be provided in order to provide similar gain.

Without limiting the scope of the present disclosure, some embodiments may be described in the context of providing detectors and detection methods in systems utilizing electron beams. However, the disclosure is not so limited. Other types of charged particle beams may be similarly applied. Furthermore, systems and methods for detection may be used in other imaging or radiation detection systems, such as optical imaging, photo detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 10 that may include a detector, consistent with embodiments of the present disclosure. EBI system 10 may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

Figure 2:
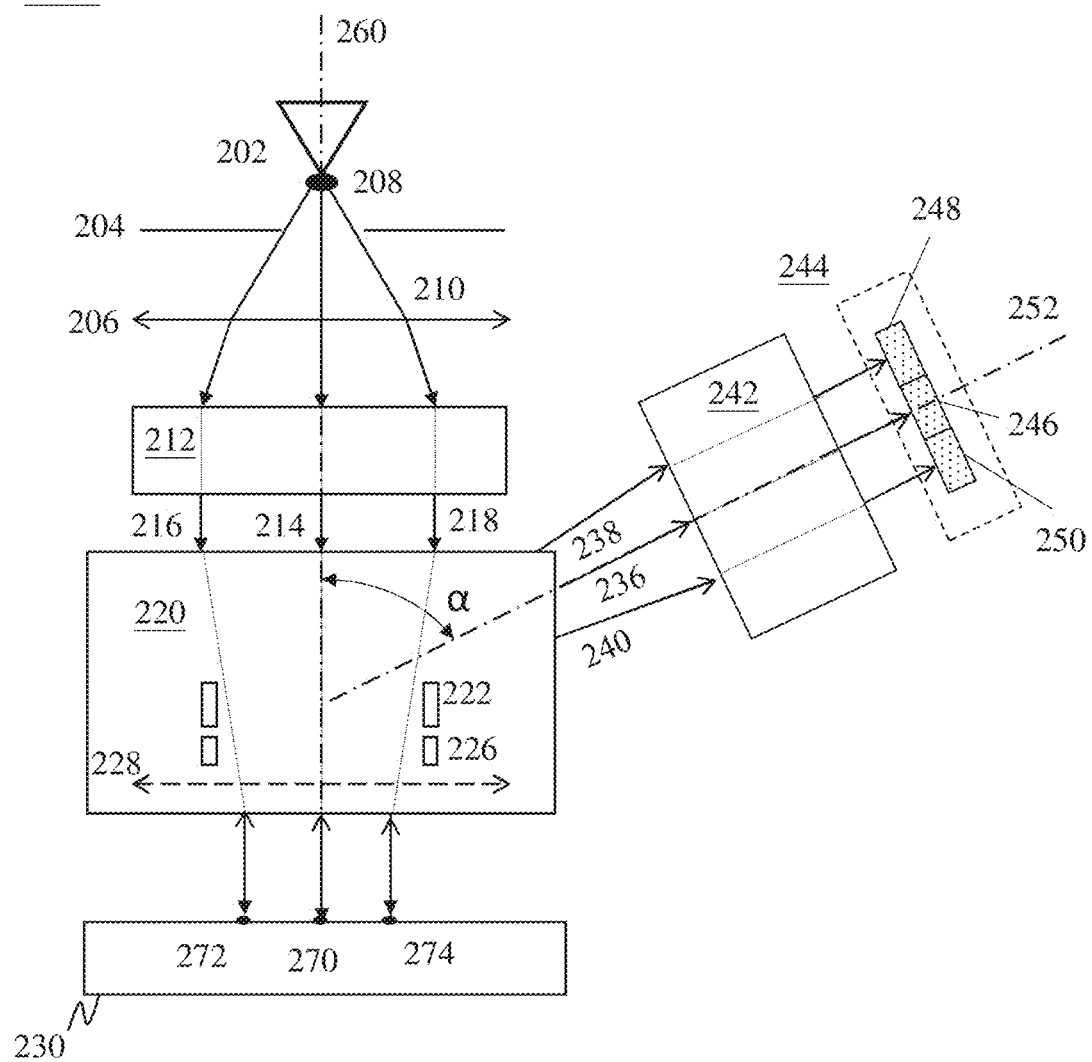
FIG. 2 is a schematic diagram illustrating an exemplary electron beam tool, consistent with embodiments of the present disclosure that may be a part of the exemplary electron beam inspection system of FIG. 1.

FIG. 2 illustrates a charged particle beam apparatus that may be a multi-beam tool that uses multiple primary electron beamlets to simultaneously scan multiple locations on a sample.

As shown in FIG. 2, an electron beam tool 100A (also referred to herein as apparatus 100A) may comprise an electron source 202, a gun aperture 204, a condenser lens 206, a primary electron beam 210 emitted from electron source 202, a source conversion unit 212, a plurality of beamlets 214, 216, and 218 of primary electron beam 210, a primary projection optical system 220, a wafer stage (not shown in FIG. 2), multiple secondary electron beams 236, 238, and 240, a secondary optical system 242, and a detector 244. Electron source 202 may generate primary particles, such as electrons of primary electron beam 210. A controller, image processing system, and the like may be coupled to detector 244. Primary projection optical system 220 may comprise a beam separator 222, deflection scanning unit 226, and objective lens 228. Detector 244 may comprise detection sub-regions 246, 248, and 250.

Electron source 202, gun aperture 204, condenser lens 206, source conversion unit 212, beam separator 222, deflection scanning unit 226, and objective lens 228 may be aligned with a primary optical axis 260 of apparatus 100A. Secondary optical system 242 and detector 244 may be aligned with a secondary optical axis 252 of apparatus 100A.

Electron source 202 may comprise a cathode, an extractor or an anode, wherein primary electrons may be emitted from the cathode and extracted or accelerated to form a primary electron beam 210 with a crossover 208. Primary electron beam 210 may be visualized as being emitted from crossover 208. Gun aperture 204 may block off peripheral electrons of primary electron beam 210 to reduce size of probe spots 270, 272, and 274.

Source conversion unit 212 may comprise an array of image-forming elements (not shown in FIG. 2) and an array of beam-limit apertures (not shown in FIG. 2). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 210. The array of beam-limit apertures may limit the plurality of beamlets 214, 216, and 218.

Condenser lens 206 may focus primary electron beam 210. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be a moveable condenser lens that may be configured so that the position of its first principle plane is movable. The movable condenser lens may be configured to be magnetic, which may result in off-axis beamlets 216 and 218 landing on the beamlet-limit apertures with rotation angles. The rotation angles change with the focusing power and the position of the first principal plane of the movable condenser lens. In some embodiments, the moveable condenser lens may be a moveable anti-rotation condenser lens, which involves an anti-rotation lens with a movable first principal plane. Moveable condenser lens is further described in U.S. Publication No. 2017/0025241, which is incorporated by reference in its entirety.

Objective lens 228 may focus beamlets 214, 216, and 218 onto a wafer 230 for inspection and may form a plurality of probe spots 270, 272, and 274 on the surface of wafer 230. Secondary particles, such as secondary electrons emanated from the wafer surface may be collected by detector 244 to form an image of an area of interest on wafer 230.

Beam separator 222 may be a beam separator of Wien filter type generating an electrostatic dipole field and a magnetic dipole field. In some embodiments, if they are applied, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 at an angle α towards secondary optical system 242.

Deflection scanning unit 226 may deflect beamlets 214, 216, and 218 to scan probe spots 270, 272, and 274 over a surface area of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 242 may focus secondary electron beams 236, 238, and 240 onto detection sub-regions 246, 248, and 250 of detector 244. Detection sub-regions 246, 248, and 250 may be configured to detect corresponding secondary electron beams 236, 238, and 240 and generate corresponding signals used to reconstruct an image of surface area of wafer 230.

Although FIG. 2 shows an example of electron beam tool 100 as a multi-beam tool that uses a plurality of beamlets, embodiments of the present disclosure are not so limited. For example, electron beam tool 100 may also be a single-beam inspection tool that uses only one primary electron beam to scan one location on a wafer at a time. Furthermore, in some embodiments, a detector may be arranged on-axis or off-axis with respect to the primary optical axis of the electron beam tool.

There may also be provided an image processing system that includes an image acquirer, a storage, and controller. The image acquirer may comprise one or more processors. For example, the image acquirer may comprise a computer, server, mainframe host, terminals, personal computer, any kind of mobile computing devices, and the like, or a combination thereof. The image acquirer may connect with detector 244 of electron beam tool 100 through a medium such as an electrical conductor, optical fiber cable, portable storage media, IR, Bluetooth, internet, wireless network, wireless radio, or a combination thereof. The image acquirer may receive a signal from detector 244 and may construct an image. The image acquirer may thus acquire images of wafer 230. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, random access rummy (RAM), cloud storage, other types of computer readable memory, and the like. The storage may be coupled with the image acquirer and may be used for saving scanned raw image data as original images, and post-processed images. The image acquirer and storage may be connected to controller 109. In some embodiments, the image acquirer, storage, and controller 109 may be integrated together as one electronic control unit. Thus, controller 109, as shown in FIG. 1, may represent an image processing system, image acquirer, and storage.

In some embodiments, controller 109 may acquire one or more images of a sample based on an imaging signal received from detector 244. An imaging signal may correspond to a scanning operation for conducting charged particle imaging. An acquired image may be a single image comprising a plurality of imaging areas that may contain various features of wafer 230. The single image may be stored in a storage. Imaging may be performed on the basis of imaging frames.

Figure 3:
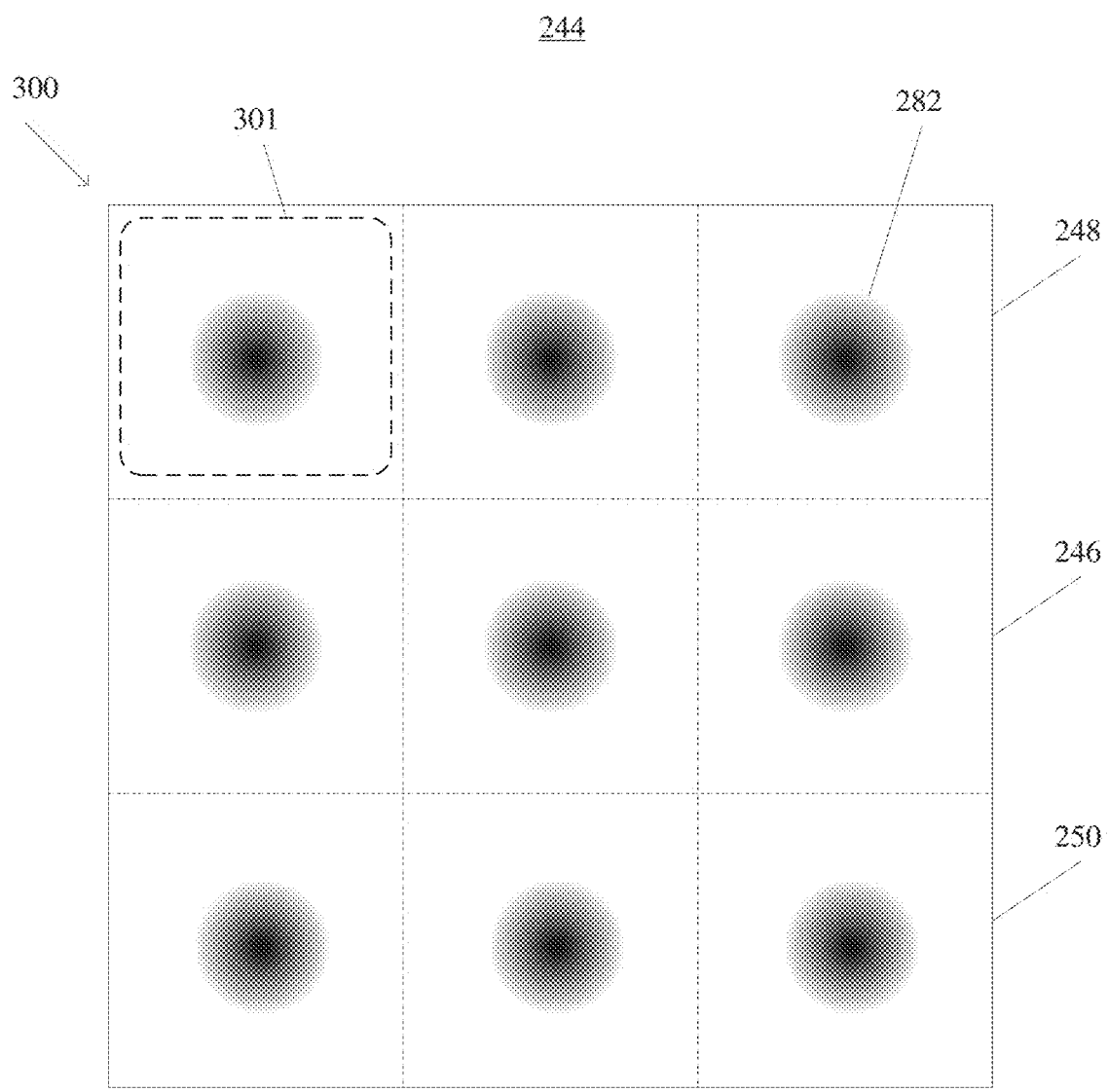
FIG. 3 is a diagram illustrating a top view of an exemplary detector, consistent with embodiments of the present disclosure.

FIG. 3 is a diagram illustrating a sensor surface 300 of detector 244, according to some embodiments of the present disclosure. Sensor surface 300 may face incident beams of secondary electrons. Sensor surface 300 may include a plurality of detection cells 301. Sensor surface 300 may include one or more sensing elements. In some embodiments, each detection cell 301 may correspond to an individual sensing element. In some embodiments, multiple detection cells may be constituted by one substrate having a plurality of sensing elements. In further embodiments, one detection cell may include multiple sensing elements.

Referring to the example shown in FIG. 3, detector 244 may be divided into nine detection cells. The detection cells may correspond to detection sub-regions including, for example, sub-regions 246, 248, and 250 of detector 240 as discussed above with respect to FIG. 2. The detection cells may be arranged in a grid as conceptually illustrated by the dashed lines in FIG. 3.

Consistent with some embodiments, sensor surface 300 need not be physically divided into detection sub-regions. That is, the dashed lines in FIG. 3 may not represent any actual structures on sensor surface 300. Rather, as described in more detail below, detection cells may be formed by providing spaced apart semiconductor regions at the bottom of detector 244. Sensing elements of detector 244 may be formed from a contiguous semiconductor substrate. Detector 244 may have a structure capable of forming internal electrical fields, which may be configured to guide the electrons incident on each detection sub-region to a corresponding detection cell. Because a detector may not require any particular structure on sensor surface 300 to separate incident electrons, the entire sensor surface 300 may be used to receive electrons. Dead area on sensor surface 300 may be substantially eliminated.

However, in some embodiments, sensor surface 300 may be physically segmented into an array of discrete sensing elements. Isolation areas may be provided between adjacent sensing elements.

One or more beams of secondary electrons may form a plurality of beam spots 282 on sensor surface 300 of detector 244. For example, nine beam spots may be formed, as shown in FIG. 3. Each detection cell may be capable of receiving a corresponding beam spot, generating a signal (e.g., voltage, current, etc.) representing the intensity of the received beam spot, and providing the signal to a data processing system for generating an image of an area of wafer 230.

Similar to the description above regarding primary beamlets 214, 216, and 218, the present disclosure does not limit the number of beams of secondary electrons. As such, the present disclosure also does not limit the number of detection cells 301 in detector 244, as well as the number of beam spots 282 detectable by detector 244. For example, consistent with disclosed embodiments, detector 244 may include an array of 2×2, 4×5, or 20×20 detection cells that may be arranged in a matrix along sensor surface 300.

Moreover, although FIG. 3 shows detection cells 301 arranged as a 3×3 rectangular grid in a plane parallel to sensor surface 300, it is appreciated that detection cells 301 may be arranged in an arbitrary manner, or that the shapes of detection cells 301 may be arbitrary. For example, in some embodiments, detection cells 301 may have a triangular or hexagonal shape.

Figure 4:
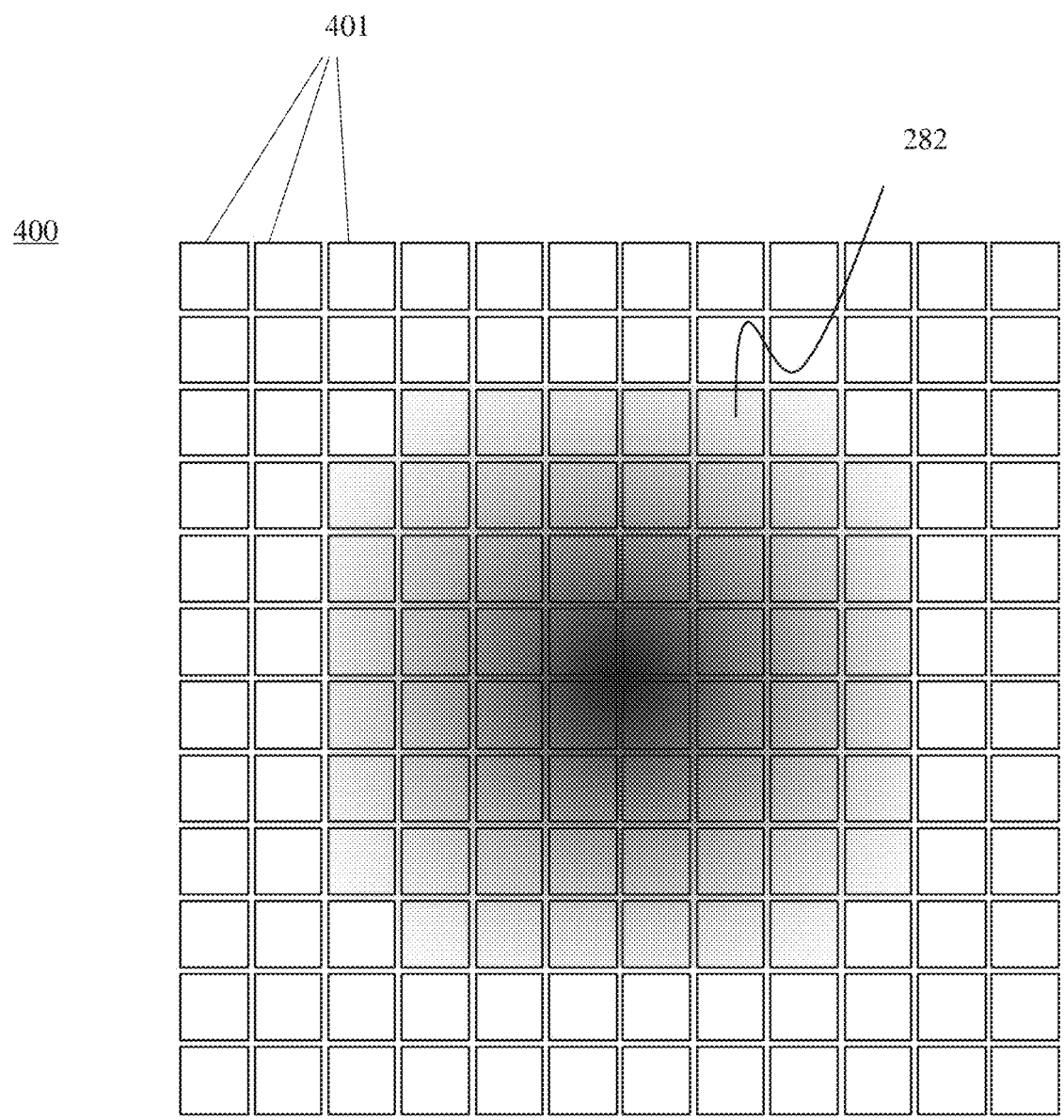
FIG. 4 is a diagram illustrating a top view of an exemplary detector with multiple sensing elements, consistent with embodiments of the present disclosure.

Reference is now made to FIG. 4, which illustrates a sensor surface 400, according to some embodiments of the present disclosure. Sensor surface 400 may represent a single detection cell. Sensor surface 400 may include a plurality of sensing elements 401. Sensor surface 400 may face an incident beam of secondary electrons such that beam spot 282 is formed thereon. Sensing elements 401 may be sized to be smaller than beam spot 282. Therefore, beam spot 282 may cover multiple sensing elements 401 in one detection cell. A plurality of sensing elements 401 associated with one beam spot may be grouped together and their output signal combined.

In some embodiments, a sensing element, such as sensing element 401, may include a diode. For example, each sensing element may include a diode such as a PIN diode. A sensing element may also be an element similar to a diode that can convert incident enemy into a measurable signal. In some embodiments, each sensing element may generate a current signal commensurate with the electrons received in the active area of the sensing element. While PIN diodes are discussed herein, it will be understood that conductivity type may be reversed in some embodiments. Thus, in addition to a PIN diode, a NIP diode structure may be used.

A sensing element may include a substrate that may comprise one or more layers. For example, the substrate of a sensing element may be configured to have a plurality of layers stacked in a thickness direction, the thickness direction being substantially parallel to an incidence direction of an electron beam. When a sensing element is formed as a PIN diode, for example, the PIN diode may be manufactured as a substrate with a plurality of layers including a p-type region, an intrinsic region, and an n-type region. One or more of such layers may be contiguous in cross-sectional view. Further layers may also be provided in addition to the sensor layer, such as a circuit layer, and a read-out layer, for example.

A preprocessing circuit may connect to the output of a sensing element and may amplify the current signal generated in the sensing element. The signal may then be converted into a voltage signal that may represent the intensity of the received electrons. The preprocessing circuit may include, for example, pre-amp circuitries such as a charge transfer amplifier (CTA), a transimpedance amplifier (TIA), or an impedance conversion circuit coupled with a CTA or TIA. A processing system may generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

Figure 5:
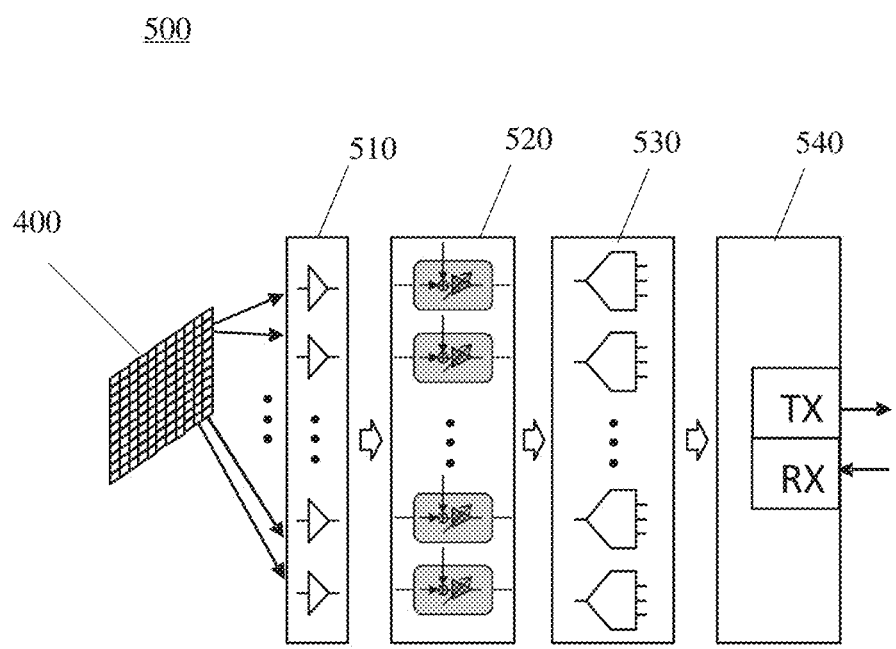
FIG. 5 is a diagram illustrating a detection system that may use a detector, consistent with embodiments of the present disclosure.

Reference is now made to FIG. 5, which illustrates a detection system 500 that may use a detector consistent with embodiments of the present disclosure. A detector may be provided having sensor surface 400 that may be used on detector 244. The detector may comprise an array of I×J sensing elements and may have M outputs to be connected with other components, such as a multiplexer. A switch matrix may be provided that groups the I×J sensing elements into M groups. The number of groups may be the same number as the number of incoming electron beams. The detector may be constructed as a substrate including a sensor layer and a circuit layer.

The detector may be connected to a signal conditioning circuit array 510. Signal conditioning circuit array 510 may have N inputs and outputs so as to be equal to or greater than the number of incoming electron beams on the sensing element array. Signal conditioning circuit array 510 may include an amplifier, among other components.

Signal conditioning circuit array 510 may be connected to a parallel analog signal processing path array 520 for providing gain and offset control. Parallel analog signal processing path array 520 may have N inputs and outputs so as to match the number of outputs from signal conditioning circuit array 510.

Parallel analog signal processing path array 520 may be connected to a parallel ADC array 530, which may have N inputs and outputs so as to match the number of outputs from parallel analog signal processing path array 520.

Parallel ADC array 530 may be connected to digital control unit 540. Digital control unit 540 may comprise a controller that may communicate with other components, including parallel analog signal processing path array 520, and with the sensing element array. Digital control unit 540 may send and receive communications from a deflection and image control (DIC) unit via a transmitter TX and a receiver RX.

Detection system 500 may be useful for processing output from sensing elements based on analog signals. However, in some embodiments, other forms of a detection system may be used. For example, a detection system may be provided that is useful for processing output from sensing elements based on electron counting.

In a detection system based on electron counting, raw detection signals from sensing elements may be fed into an electric circuit for signal processing. For example, there may be provided front-end electronics that may include a current buffer and a transimpedance amplifier. After amplification, signal output from each of the individual circuits of the front-end electronics may be fed into event detector. The event detector may include a discriminator block having circuitry configured to compare an incoming signal against a reference level and output a signal such as a flag when the incoming signal level is higher than the reference level, for example.

A detection system based on electron counting may differ from that of FIG. 5 in that the event detector may be provided instead of an ADC block, such as parallel ADC array 530, among other things. Such an event detector may be useful in counting electrons. Further components may be provided, such as a count buffer in each sensing element, count summing units, and an external controller that may be configured to execute imaging control.

Figure 6A:
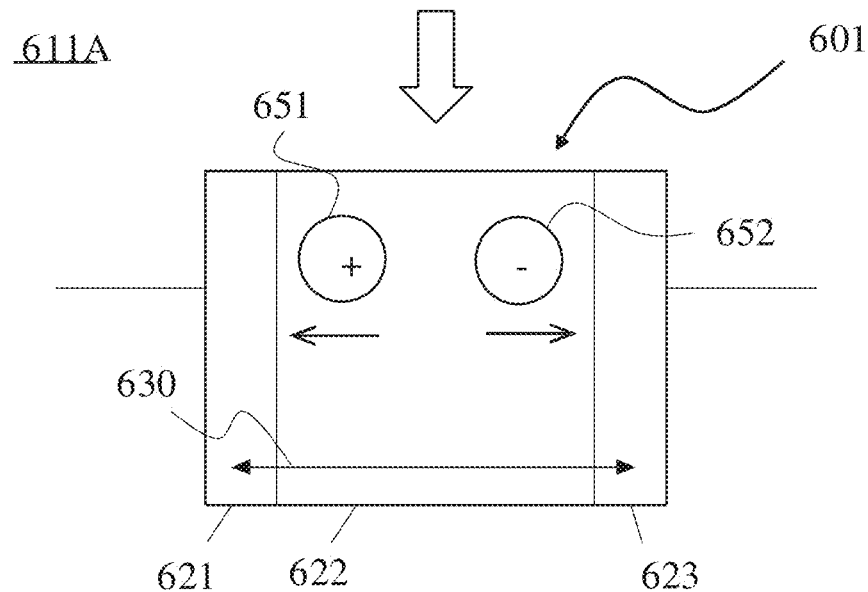
FIGS. 6A and 6B are diagrams illustrating cross-sectional views of individual sensing elements, consistent with embodiments of the present disclosure.
Figure 6B:
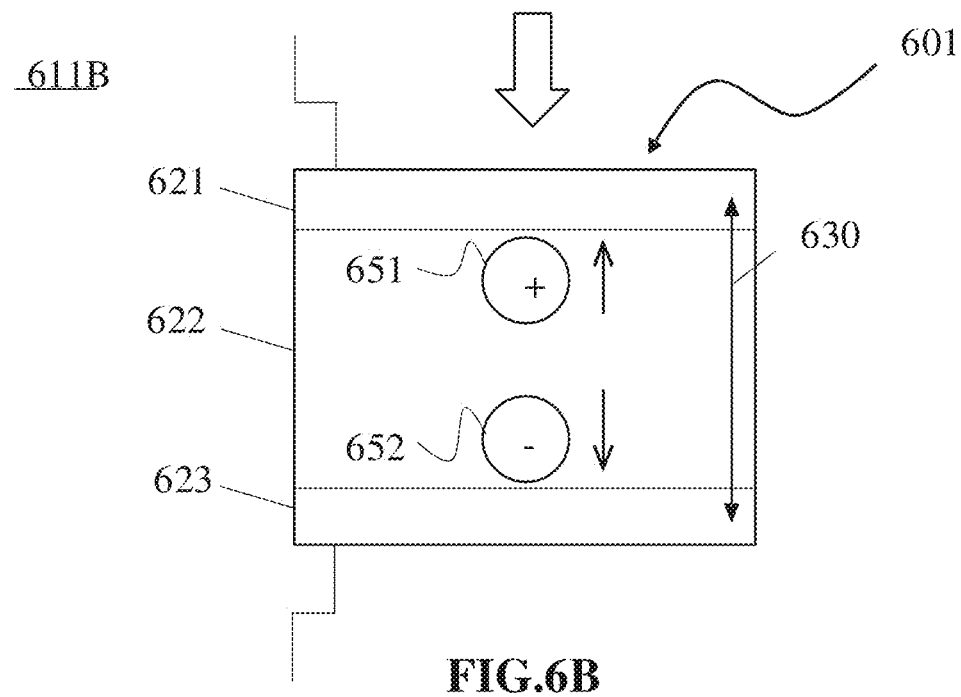

FIGS. 6A and 6B show schematic illustrations of individual sensing elements, which may be an example of one of sensing elements 401 as discussed above with respect to FIG. 4. For example, in FIG. 6A, a sensing element 611A is shown. Sensing element 611A may include a semiconductor structure with a p-type layer 621, an intrinsic layer 622, and an n-type layer 623. Sensing element 611A may include two terminals, such as an anode and a cathode. Sensing element 611A may be reverse biased in operation, and a depletion region 630 may form and may span part of the length of p-type layer 621, substantially the entire length of intrinsic layer 622, and part of the length of n-type layer 623. In depletion region 630, charge carriers may be removed, and new charge carriers generated in depletion region 630 may be swept away according to their charge. For example, when an incoming charged particle reaches sensor surface 601, electron-hole pairs may be created, and a hole 651 may be attracted toward p-type layer 621 while an electron 652 may be attracted toward n-type layer 623. In some embodiments, a protection layer may be provided on sensor surface 601. The protection layer may be permeable to incident electrons.

As shown in FIG. 6B, a sensing element 611B may operate in a similar manner to that of sensing element 611A except that an orientation is changed. For example, p-type layer 621 may include sensor surface 601. P-type layer 621 may be exposed to incident charged particles. Thus, an incident charged particle may interact with p-type layer 621 and depletion region 630, and may generate electron-hole pairs. In some embodiments, a metal layer may be provided on top of p-type layer 621.

In operation, a depletion region of a sensing element may function as a capture region. An incoming charged particle may interact with the semiconductor material in the depletion region and generate new charges by a knock-out effect. For example, the sensing element may be configured such that a charged particle having a certain amount of energy or greater may cause electrons of the lattice of the semiconductor material to be dislodged, thus creating electron-hole pairs. The resulting electrons and holes may be caused to travel in opposite directions due to, for example, an electric field in the depletion region. Generation of carriers that travel toward terminals of the sensing element may correspond to current flow in the sensing element.

In some situations, an electron incident on a sensing element of a detector may have relatively large energy. For example, an incoming electron generated from interactions with a sample and a primary electron beam may arrive at a detector having kinetic energy of about 10,000 eV. A semiconductor diode of the detector may be configured such that about 3.6 eV of energy is required to knock a bound electron free and thus generate an electron-hole pair. In comparison, for reference, a photon may have energy on the order of about 1 eV.

An incident electron may interact with the semiconductor material of a diode by knocking out electrons in the lattice until its energy reduces to a level insufficient to knock out additional electrons. Thus, an electron of 10,000 eV may generate about 2,700 electron-hole pairs. The carriers of these electron-hole pairs may be collected at the terminals of the diode and may contribute to output as a current signal. In this way, electrons may generate significantly stronger electrical signal in a diode as compared to photons, and thus diodes may be useful for detection of secondary electrons.

However, secondary electrons may be generated from the sample with a broad distribution of energy depending on, for example, the properties of the materials in the sample. Accordingly, some electrons may have substantially less energy than others and may not create a large cascade of electron-hole pairs. In situations where energy of incoming electrons is relatively low, the internal gain of a diode may be correspondingly low. Therefore, there may be a desire to add gain by providing a separate amplifier.

In some embodiments, an amplifier may be provided that may include a diode configured to operate in an avalanche mode. An avalanche diode may generate an internal electric field strong enough to generate additional charges from an input. Electric fields in a diode may cause charge carriers to be accelerated toward respective terminals. For example, a diode may be biased by applying voltages to terminals thereof such that a strong electric field is formed in the diode. Due to such a field, carriers may be accelerated to speeds high enough to knock out additional carriers (e.g, electrons) in the semiconductor lattice of the diode. Thus, the higher the voltage applied to the diode, the more electron-hole pairs may be created in response to an input. However, increasing voltage may have certain detrimental consequences. For example, there may be increased arcing risk, and an attached detector and accompanying circuitry may be damaged. Thus, although increasing voltage may increase gain in the diode, doing so may also contribute to noise and may have other adverse effects.

Additionally, electron-hole pair generation in an avalanche diode may be a stochastic process that may involve some randomness. For example, due to collisions with other particles, an electron may dissipate its energy in processes not directly related to electron-hole pair generation. As a result, not all of an input's energy may be consistently converted into electron-hole pair generation by the knock-out process. Instead, some noise may be introduced.

Semiconductor electron detection devices may typically have lower noise but lower gain compared to devices involving scintillators. Furthermore, the gain of semiconductor electron detection devices may rely on the energy of incoming electrons, and thus may have low gain in low electron energy situations. For reasons such as these, SNR improvements for low energy electron detection applications may be impeded.

In some embodiments of the disclosure, a gain element may be incorporated in a detector together with a sensing element. A detector may include a substrate with a plurality of layers of semiconductor material. The gain element and the sensing element may be integrated in the substrate. This may help to achieve shorter connections between the gain element and the sensing element. An element providing gain may be embedded directly into a detector so that detection signal may be made stronger, and SNR may be improved, before the signal is fed to external components. Thus, noise contributions from external sources, such as amplifiers, may be made less significant. Furthermore, adding the function of gain adjustment to a substrate with a sensing element may help to increase the dynamic range of a detector and may thus improve the dynamic range of an imaging sub-system of an SEM. The gain element may be configured to provide an adjustable gain by, for example, controlling a bias current applied to the gain element. A detector may be compatible with a wide range of electron beam intensities.

The gain element may be a built-in gain block provided in the substrate that makes up the sensing element of a detector. The sensing element may include a PIN diode. By providing a gain element that is integrated with a sensing element, an output signal of the sensing element may be strengthened before the signal is routed out to external components through interconnects. Furthermore, the need to provide amplification through a separate amplifier may be reduced. Accordingly, a detection signal that may form the basis for further amplification may be strengthened before further noise sources are introduced, thus improving total SNR of a detection system.

Figure 7A:
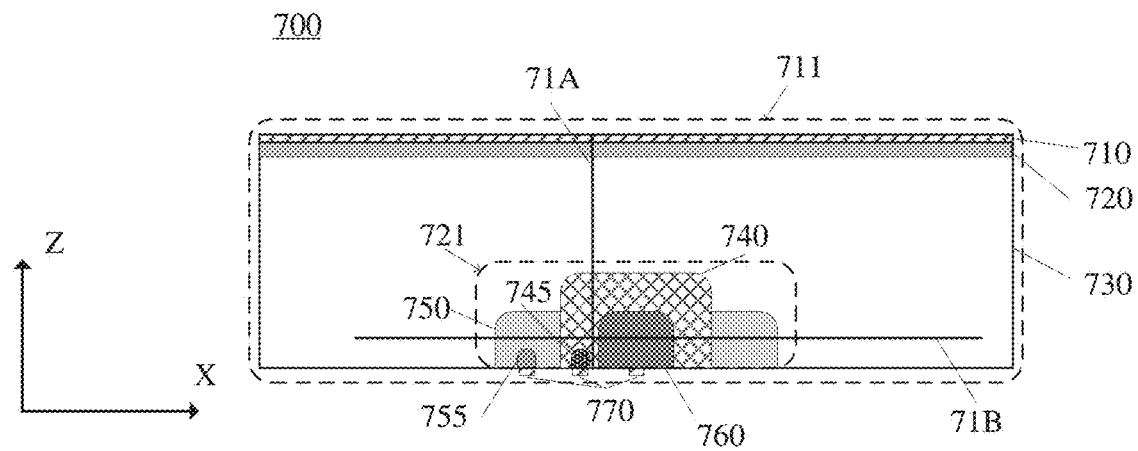
FIGS. 7A, 7B, and 7C are views of a structure of a substrate including a sensing element and a gain element, consistent with embodiments of the present disclosure.
Figure 7B:
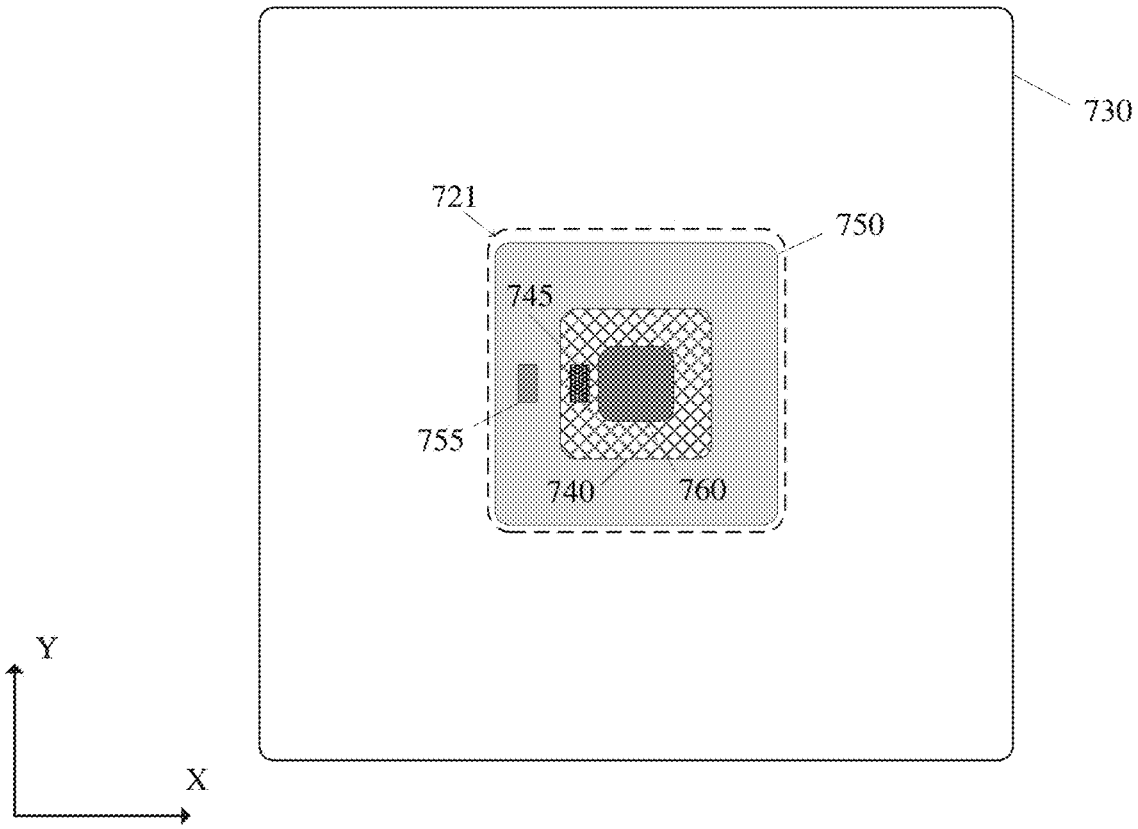

FIGS. 7A and 7B illustrate a structure of a substrate 700 including a sensing element 711 and a gain element 721, consistent with embodiments of the disclosure. FIG. 7A shows a cross section of substrate 700 in a plane parallel to an incidence direction of a beam of charged particles. In the coordinate axes illustrated, the Z-direction may be parallel to the incidence direction and may correspond to a thickness direction of substrate 700, and the X-direction may correspond to a direction orthogonal to the Z-direction. Sensing element 711 and gain element 721 may be aligned in a direction parallel to the incidence direction. For example, sensing element 711 and gain element 721 may be arranged to be stacked on top of one another in the thickness direction of substrate 700.

FIG. 7B is a bottom view of substrate 700. Some elements may be omitted for clarity, such as wirings 770. In the coordinate axes illustrated, the X-direction and the Y-direction may form a two-dimensional plane that may be perpendicular to the incidence direction.

Substrate 700 may include a layered structure with a plurality of semiconductor or other regions of differing conductivity. Conductivity may refer to semiconductor conductivity type, such as p-type or n-type, or conductivity level, such as the extent of doping by implanted species. The layers of substrate 700 may be formed one on top of the other in the thickness direction of substrate 700. Metalized portions may also be provided. As shown in FIG. 7A, a metal layer 710 may be provided as a top surface of substrate 700. Metal layer 710 may be configured as an electron-incident surface. Metal layer 710 may form a sensor surface of a detector, such as detector 244. Metal layer 710 may include aluminum.

A semiconductor region 720 may be provided adjacent to metal layer 710. Semiconductor region 720 may include a region of a first conductivity. The first conductivity may be an n-type semiconductor. Semiconductor region 720 may be formed by implanting dopant species in substrate 700. Thus, semiconductor region 720 may be n-doped. The doping concentration may be relatively heavy. In some embodiments, semiconductor region 720 may include an n++ semiconductor.

A semiconductor region 730 may be provided adjacent to semiconductor region 720. Semiconductor region 730 may include a region of a second conductivity, the second conductivity being different from the first conductivity. The second conductivity may be a p-type semiconductor. Semiconductor region 730 may be an intrinsic region. Semiconductor region 730 may have a doping concentration that is set so that it has a high resistance as a result of being lightly doped. Substrate 700 may be formed from a p-type blank wafer, for example, in which case the intrinsic region may include a p− semiconductor.

A semiconductor region 740 may be provided adjacent to semiconductor region 730. Semiconductor region 740 may include a region of second conductivity. Semiconductor region 740 may include a p+ semiconductor.

Sensing element 711 may include semiconductor regions 720, 730, and 740. Semiconductor regions 720 and 740 may form the terminals of a PIN diode. In operation, sensing element 711 may provide the function of generating electrical signals in response to a charged particle arrival event at the detector. Incoming charged particles, such as electrons, may pass through metal layer 710 and may enter semiconductor region 720. A depletion region may be formed spanning nearly the entire thickness of semiconductor region. 720 and semiconductor region 730. The incoming electrons may interact with the material of semiconductor regions 720 and 730 and may generate electron-hole pairs. Electrons and holes of the generated electron-hole pairs may be guided by internal electric fields in sensing element 711 so that the electrons travel toward semiconductor region 720 and the holes travel toward semiconductor region 740. Meanwhile, semiconductor region 740 may act as the base of a gain block and may help to provide a gain function, as shall be discussed below.

Gain element 721 may include semiconductor region 740 along with a semiconductor region 750 and a semiconductor region 760. Gain element 721 may include a bipolar junction transistor (BJT). Gain element 721, acting as a BJT, may have a base, collector, and emitter terminal. Semiconductor region 740 may form the base of gain element 721, which may be shared with sensing element 711 where semiconductor region 740 may act as a terminal of a PIN diode. Gain element 721 and sensing element 711 may be directly connected through an integrated structure, thus obviating the need for external connections that may cause signal-to-noise ratio degradation due to interference.

A BJT may control the amount of current flowing through the emitter, base, and collector terminals. In some embodiments, a relatively small current flowing into the base terminal may control a much larger current flowing between the collector and emitter terminals. A BJT may act as a switch where a large current (or other signal) flowing between two terminals is adjusted with a smaller current applied to a different terminal. The BJT may also act as an amplifier that adds gain to an input signal flowing into the base terminal.

Semiconductor region 750 of gain element 721 may be provided adjacent to semiconductor region 740. Semiconductor regions 750 and 740 may be next to one another in the X-direction or Y-direction of substrate 700. Likewise, semiconductor region 760 may be provided adjacent to semiconductor region 740. Semiconductor region 760 may be sandwiched between parts of semiconductor region 740. Semiconductor region 740 may be sandwiched between parts of semiconductor region 750. And semiconductor region 750 may be sandwiched between parts of semiconductor region 730.

Semiconductor region 750 may include a region of first conductivity. Semiconductor region 750 may include an n+ semiconductor. In some embodiments, semiconductor region 750 may act as the collector terminal of a BJT of gain element 721.

Semiconductor region 760 may include a region of second conductivity. Semiconductor region 760 may have a doping concentration higher than that of other regions of second conductivity. Semiconductor region 760 may include an n+++ semiconductor. In some embodiments, semiconductor region 760 may act as the emitter terminal of a BJT of gain element 721.

Semiconductor regions 740, 750, and 760 may each have an internal region that may form an ohmic contact with a pad in a metal layer. For example, semiconductor region 745 may be embedded in semiconductor region 740, and semiconductor region 755 may be embedded in semiconductor region 750. Semiconductor regions 745 and 755 may each have higher doping concentrations than the respective materials they are embedded in. For example, semiconductor region 745 may include a p++ semiconductor, and semiconductor region 755 may include an n++ semiconductor. A metal wire or pad may be in direct contact with semiconductor region 745 or semiconductor region 755. Forming ohmic contacts may be useful for forming connections with gain element 721 with low impedance.

Wirings 770 may be provided on a bottom surface of substrate 700. Wirings 770 may include aluminum and may constitute a wiring layer patterned on substrate 700.

Sensing element 711 may include a section in which, along the Z-direction, semiconductor regions 720, 730, and 740 are provided. Semiconductor region 730 may be interposed between semiconductor regions 720 and 740. For example, along line 71A, semiconductor regions are provided in the order of 720, 730, and 740.

Gain element 721 may include a section in which, along the X-direction or Y-direction, semiconductor regions 750, 740, and 760 are provided. Semiconductor region 740 may be interposed between semiconductor regions 750 and 760. For example, along line 71B, semiconductor regions are provided in the order of 750, 740, and 760. Semiconductor region 730 may surround semiconductor regions 750, 740, and 760.

Figure 7C:
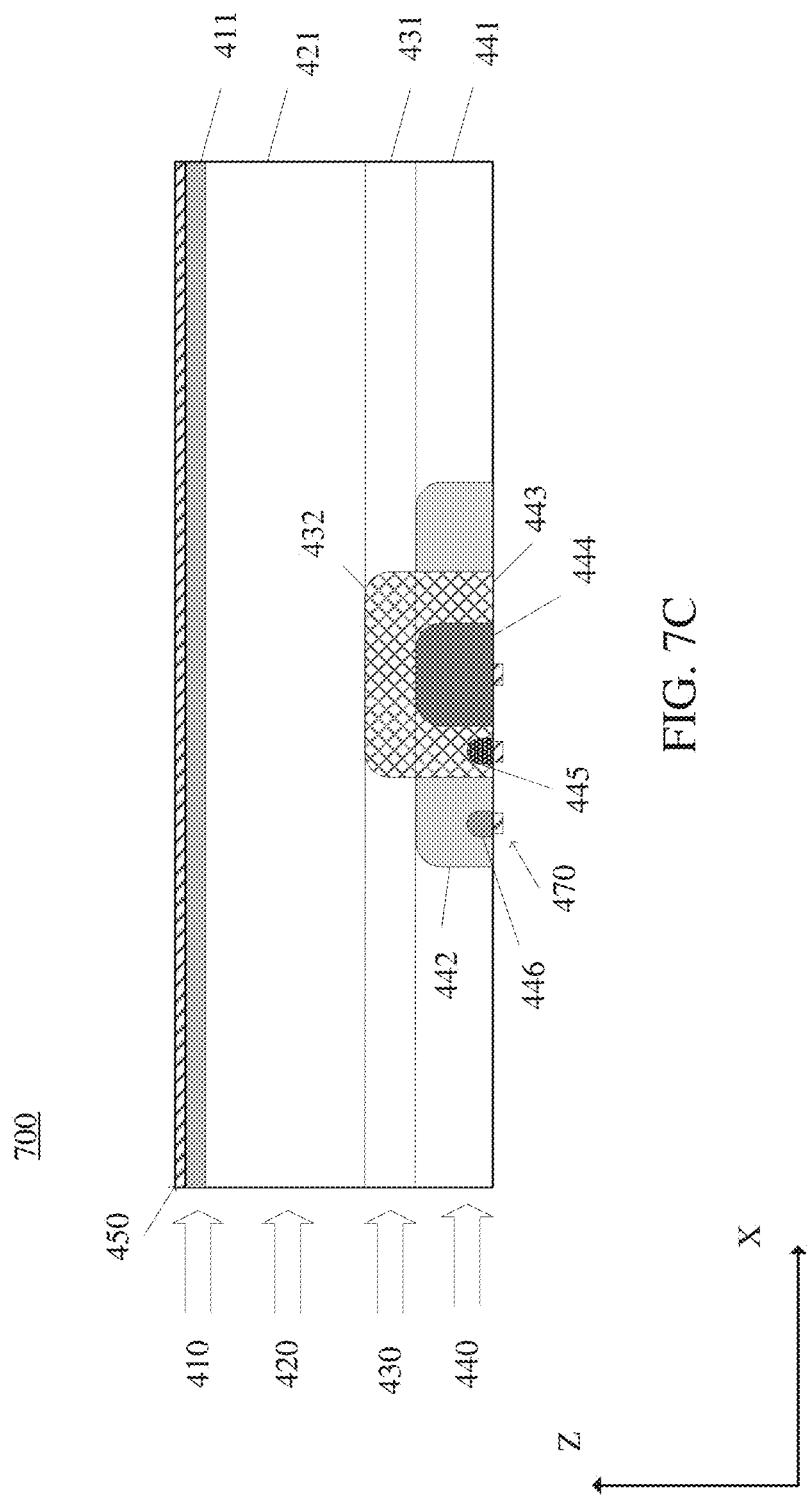

Reference is now made to FIG. 7C, which illustrates substrate 700 in terms of a layer structure, consistent with embodiments of the disclosure. Substrate 700 may include a plurality of layers stacked in the thickness direction thereof. In some embodiments, a first layer 410 may be provided. First layer 410 may include a region 411 of a first conductivity. The first conductivity may be an n-type semiconductor. Region 411 may include an n++ semiconductor.

Adjacent to first layer 410, a second layer 420 may be provided. Second layer 420 may include a region 421 of a second conductivity. The second conductivity may be a p-type semiconductor. Region 421 may include an intrinsic region and may include a p− semiconductor.

Adjacent to second layer 420, a third layer 430 may be provided. Third layer 430 may include a region 432 of a third conductivity interposed between a region 431 of the second conductivity. The third conductivity may be an n-type semiconductor. Region 432 may include a p+ semiconductor. Region 431 may be continuous with region 421.

Adjacent to third layer 430, a fourth layer 440 may be provided. Fourth layer 440 may include a region 444 of a fourth conductivity interposed between a region 443 of the third conductivity, and a region 442 of a fifth conductivity interposed between a region 441 of the second conductivity. Region 443 may be interposed between region 442. The fourth conductivity may be a heavily doped n-type semiconductor. Region 444 may include an n+++ semiconductor. Region 443 may include a p+ semiconductor. The fifth conductivity may be an n-type semiconductor. Region 442 may include an n+ semiconductor. Region 441 may include a p− semiconductor. Region 443 may be continuous with region 432, and region 441 may be continuous with region 431.

A sensing element of substrate 700 may include region 411, region 421, and region 432. A gain element of substrate 700 may include region 442, region 444, and region 443. The sensing element may further include region 443, region 431 and region 441. The gain element may further include region 432. The sensing element and the gain element may include a common terminal. For example, region 432 and region 443 may make up a base of a BJT. Furthermore, region 432 and region 443 may make up a terminal of a PIN diode. At least part of the structure of the sensing element may be shared with a part of the structure of the gain element.

Furthermore, substrate 700 may be provided with a metal layer 450 and a metal layer 470. Metal layers 450 and 470 may include aluminum. Metal layers 450 and 470 may form contacts for connecting substrate 700 with other components.

In some embodiments, there may also be provided a region 445 of sixth conductivity embedded in region 443, and a region 446 of seventh conductivity embedded in region 442. The sixth conductivity may be a p-type semiconductor, and region 445 may include a p++ semiconductor. The seventh conductivity may be an n-type semiconductor, and region 446 may include an n++ semiconductor.

In some embodiments, substrate 700 may merge together the functions of a sensing element and a gain element. The gain element may include a BJT. Thus, there may be provided a built-in gain block in a substrate that includes a sensing element. Detection of charged particles, such as electrons, may be achieved by, for example, electron-hole pair generation in response to incident electrons arriving at a sensor surface and interacting with a sensing element of a detector. Gain may be provided by the built-in gain block, for example in the form of a BJT. Current gain may be adjusted by changing the bias applied to the BJT. Dynamic range of the sensing element may be enhanced. Furthermore, added gain provided by the built-in gain block may help to improve SNR of a detector by boosting a detection signal before it is routed outside of a sensing element. This may cause contribution of noise due to, for example, providing amplifier stages following a sensing element to be insignificant. A signal from an active electron detection area of a sensing element may be directly fed to the input terminal of a corresponding gain element. Accordingly, in some embodiments, noise due to signal paths, and noise due to electromagnetic interference may be reduced. Overall system level SNR may be improved. Additionally, a separation of electron detection area in a sensing element and of current gain block in a detection device may help enhance performance optimization of respective functions.

In an embodiment consistent with FIG. 7A, incoming electrons may enter sensing element 711. Sensing element 711 may be operated as a diode in reverse bias mode. In a depletion region, which may include parts of semiconductor region 720 and semiconductor region 730, electron signal may be multiplied according to the energy of the incoming electrons. After multiplication, holes including those generated by the incoming electrons and those generated by the multiplication effect may be guided to semiconductor region 740, which may act as the base of a BJT of gain element 721. In gain element 721, current signal from the flowing holes may be amplified so that signal amplitude is further increased.

In some embodiments, the need for providing amplification via an amplifier, such as an amplifier included in signal conditioning circuit array 510 (see FIG. 5) may be reduced. Therefore, the proportion of amplification provided by a separate amplifier may be made smaller, and corresponding noise may be small. In some embodiments, a smaller amplifier may be provided as compared to a detection system where no built-in gain element is provided.

In some embodiments, a gain element may be one of a plurality of gain elements. The plurality of gain elements may be integrated together in a substrate containing a sensing element. A gain block following a sensing element may be a single BJT or a BJT array. Multiple BJTs may be associated with one sensing element, in which case, system redundancy and reliability may be enhanced. In some embodiments, a BJT array may be provided in a detector with multiple detection cells (which may include multiple sensing elements) so that each BJT may be associated with each detection cell. This may enhance packing density and enable further miniaturization.

Figure 8A:
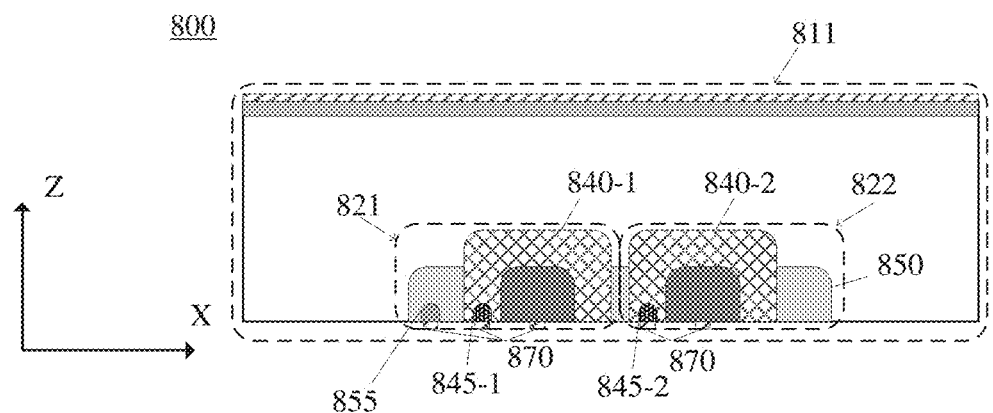
FIGS. 8A and 8B are views of a structure of a substrate including a sensing element and a gain element array, consistent with embodiments of the present disclosure.
Figure 8B:
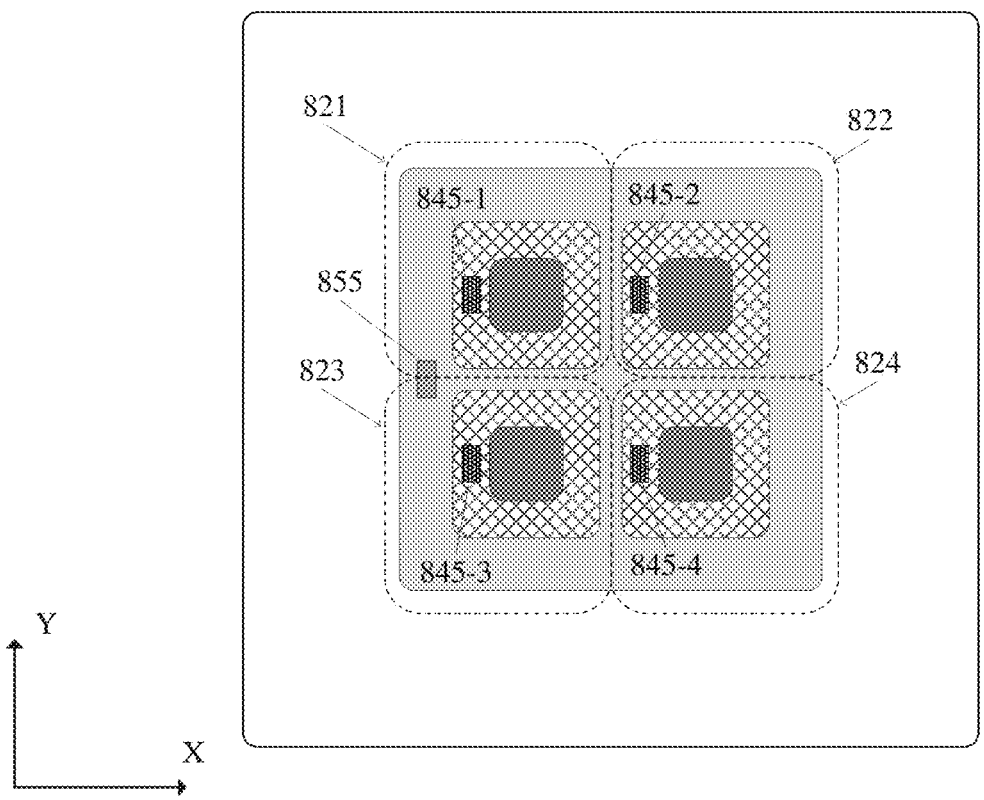

Reference is now made to FIGS. 8A and 8B, which illustrate a structure of a substrate 800 including a sensing element 811 and a plurality of gain elements 821, 822, 823, and 824, consistent with embodiments of the disclosure. FIG. 8A shows a cross section of substrate 800 in a plane parallel to an incidence direction of a beam of charged particles. In the coordinate axes illustrated, the Z-direction may be parallel to the incidence direction and may correspond to a thickness direction of substrate 800, and the X-direction may correspond to a direction orthogonal to the Z-direction. Sensing element 811 may be stacked on top of gain elements 821, 822, 823, and 824 in a direction parallel to the incidence direction.

FIG. 8B is a bottom view of substrate 800. Some elements may be omitted for clarity, such as wirings 870. Substrate 800 may be similar to substrate 700 discussed above with reference to FIGS. 7A-7C, except that an array of multiple gain elements is provided, for example.

As shown in FIG. 8A, substrate 800 may include a first semiconductor region 840-1 of second conductivity and a second semiconductor region 840-2 of second conductivity. First and second semiconductor regions 840-1 and 840-2 may include a p+ semiconductor. First and second semiconductor regions 840-1 and 840-2 may act as bases of respective BJTs.

As shown in FIGS. 8A and 8B, semiconductor regions 840-1, 840-2, and 850 may each form an ohmic contact with a pad in a metal layer. For example, semiconductor regions 845-1 and 845-2 may be embedded in semiconductor regions 840-1 and 840-2, respectively. Furthermore, semiconductor region 855 may be embedded in semiconductor region 850. Semiconductor regions 845-1, 845-2, and 855 may each have higher doping concentrations than the respective materials they are embedded in. For example, semiconductor regions 845-1 and 845-2 may include a p++ semiconductor, and semiconductor region 855 may include an semiconductor. As shown in FIG. 8B, there may be only one semiconductor region 855 provided in a BJT, where semiconductor region 855 may form an ohmic contact with a pad in a metal layer.

Wirings 870 may be provided on a bottom surface of substrate 800. Wirings 870 may include aluminum and may constitute a wiring layer patterned on substrate 800.

In some embodiments, under a condition of providing a gain block of the same size, a gain block including a BJT array may include individual BJT elements that are smaller than a corresponding single-element BJT. Gain elements that are in the form of a smaller BJT array rather than a larger single BJT with the same overall size may be advantageous in aspects of speed, overall reliability, device robustness, device uniformity, and heat dissipation. In some embodiments, each BJT element in an array arrangement may be controlled to be enabled or disabled individually. If some BJT elements in a BJT array have defects or become damaged during operation, they may be disabled and electrons from the active area of a sensing element may be guided to other enabled BJT elements in the same BJT array. In this manner, the overall detection device including the BJT array may maintain functionality even if one individual BJT element fails. In a large electron detection device, each sensing element in the device may have one detection area with one BJT as a gain block, or one detection area with one BJT array as a gain block.

In some embodiments conductivity type of a device may be changed. Polarity of an output signal of a gain block may be different from that discussed above. Changing conductivity type may cause charge carriers to take different routes through a detector device. This may have effects on bandwidth in a detector device because charge carriers may have different mobility, e.g., electrons being more mobile than holes.

Figure 9A:
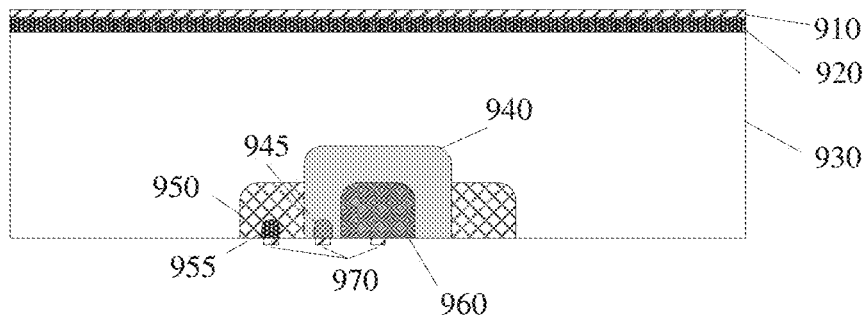
FIGS. 9A and 9B are views of a structure of a substrate including a sensing element and a gain element or gain element array, consistent with embodiments of the present disclosure.
Figure 9B:
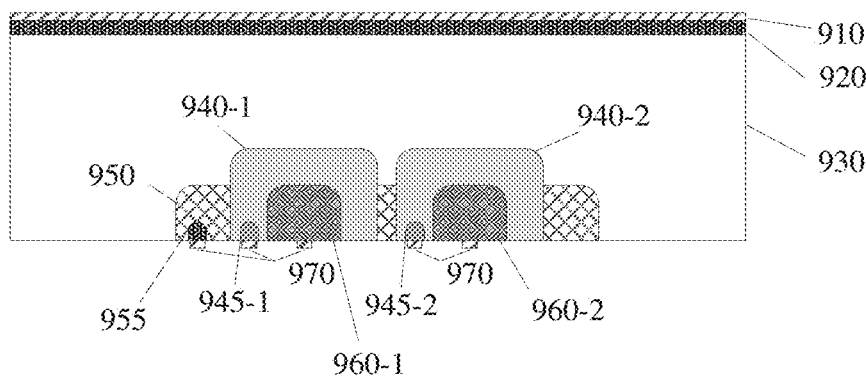

Reference is now made to FIGS. 9A and 9B, which illustrate a substrate 900 with a sensing element and one or more gain elements, consistent with embodiments of the disclosure. Substrate 900 may be similar to substrate 700 discussed above with respect to FIGS. 7A-7C, except that substrate 900 includes semiconductor regions of conductivity opposite to that of substrate 700, for example.

Substrate 900 may include a layered structure with a plurality of semiconductor or other regions of differing conductivity. As shown in FIG. 9A, a metal layer 910 may be provided as a top surface of substrate 900. Metal layer 910 may be configured as an electron-incident surface. Metal layer 910 may form a sensor surface of a detector, such as detector 244. Metal layer 910 may include aluminum.

A semiconductor region 920 may be provided adjacent to metal layer 910. Semiconductor region 920 may include a region of a first conductivity. The first conductivity may be a p-type semiconductor. Semiconductor region 920 may be formed by implanting dopant species in substrate 900. Thus, semiconductor region 920 may be p-doped. The doping concentration may be relatively heavy. In some embodiments, semiconductor region 920 may include a p++ semiconductor.

A semiconductor region 930 may be provided adjacent to semiconductor region 920. Semiconductor region 930 may include a region of a second conductivity, the second conductivity being different from the first conductivity. The second conductivity may be an n-type semiconductor. Semiconductor region 930 may be an intrinsic region. Semiconductor region 930 may have a doping concentration that is set so that is has a high resistance as a result of being lightly doped. Substrate 900 may be formed from an n-type blank wafer, for example, in which case the intrinsic region may include an n– semiconductor.

A semiconductor region 940 may be provided adjacent to semiconductor region 930. Semiconductor region 940 may include a region of second conductivity. Semiconductor region 940 may include a semiconductor.

A sensing element of substrate 900 may include semiconductor regions 920, 930, and 940. Semiconductor regions 920 and 940 may form the terminals of a PIN diode. In operation, the sensing element may provide the function of generating electrical signals in response to charged particle arrival events at the detector. Incoming charged particles, such as electrons, may pass through metal layer 910 and may enter semiconductor region 920. A depletion region may be formed spanning nearly the entire thickness of semiconductor region 920 and semiconductor region 930. The incoming electrons may interact with the material of semiconductor regions 920 and 930 and may generate electron-hole pairs. Electrons and holes of the generated electron-hole pairs may be guided by internal electric fields in the sensing element so that the electrons travel toward semiconductor region 940, while holes may travel in opposite directions. Meanwhile, semiconductor region 940 may act as the base of a gain block and may help to provide a gain function, as shall be discussed below.

A gain element of substrate 900 may be similar to that of substrate 700, except that polarity of terminals is reversed. Therefore, the polarity of the output signal may be opposite that of the example of substrate 700. The gain element of substrate 900 may include semiconductor region 940 along with a semiconductor region 950 and a semiconductor region 960. The gain element may include a BJT having a base, collector, and emitter terminal. Semiconductor region 940 may form the base of the gain element, which may be shared with the sensing element of substrate 900 where semiconductor region 940 may act as a terminal of a PIN diode. The gain element and sensing element may be directly connected through an integrated structure.

As shown in FIG. 9B, an array of BJTS may be provided in substrate 900, similar to the exemplary embodiment illustrated in FIGS. 8A and 8B.

Figure 10A:
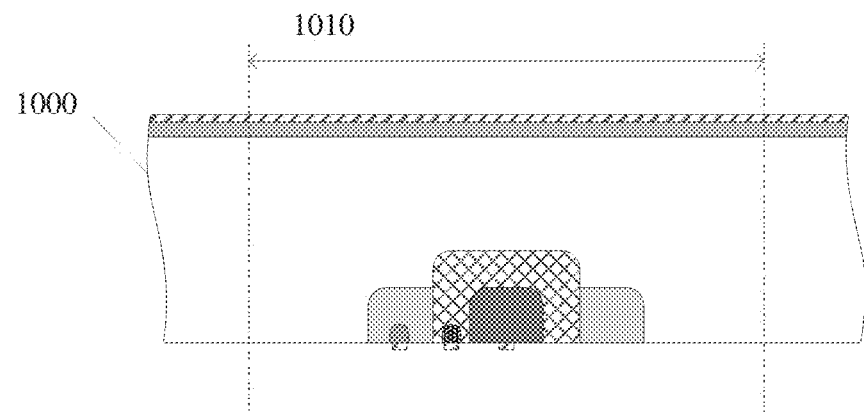
FIGS. 10A and 10B illustrate a substrate that may have multiple detection cells or sensing elements, consistent with embodiments of the present disclosure.
Figure 10B:
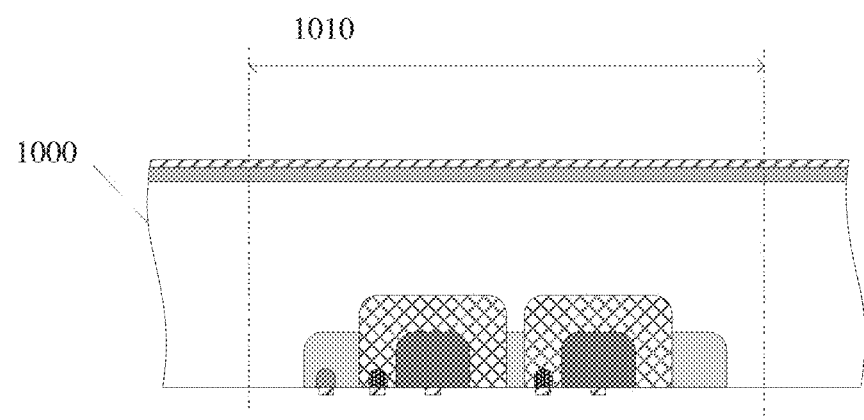

Reference is now made to FIGS. 10A and 10B, which illustrate a substrate 1000 that may have multiple detection cells or sensing elements, consistent with embodiments of the disclosure. Substrate 1000 may include multiple sensing elements corresponding to respective detection cells. FIG. 10A shows detection cell 1010 as a part of substrate 1000. Substrate 1000 may include an array of multiple detection cells, such as the exemplary embodiment illustrated in FIG. 3. Furthermore, in some embodiments, substrate 1000 may include an array of multiple sensing elements, such as the exemplary embodiment illustrated in FIG. 4. In some embodiments, detector 244 may be provided as a single substrate configured to have one or more detection cells, each detection cell including one or more sensing elements. FIG. 10B shows substrate 1000 with detection cell 1010 that may be include multiple gain elements in the form of an array. The multiple gain elements contained in one detection cell may correspond to a single sensing element. The arrangement of a sensing element, such as that shown in FIG. 10A or FIG. 10B, may be repeated throughout a substrate that forms a detector.

In some embodiments, the size of device structures including semiconductor regions may influence device parasitics, such as stray capacitance. For example, BJTs according to some embodiments of the disclosure may be realized in the form of a lateral device. Thus, when device size shrinks, the thickness of the base area between the emitter and collector of the BJT also shrinks. This may result in lower transit time, which may help to improve device speed. Other parasitic parameters such as junction capacitances may relate to device layout and may be adjusted by modifying detailed device layout accordingly. Furthermore, an array structure may be helpful to improve the uniformity of the device and reduce performance differences between devices. Additionally, the array structure may help to improve heat dissipation in sensing elements. Improved heat dissipation may be significant, especially in BJTs, because BJTs may have a property that hot spots may develop when the current running through the device becomes high. The generation of hot spots may be one cause of BJT damage. Thus, improving heat dissipation may avoid BJT damage due to hot spotting.

A method of forming a substrate will now be discussed with reference to FIGS. 11A-I. Forming a substrate may comprise forming regions of differing conductivity in a base material. The process may include steps of semiconductor processing, including semiconductor doping, for example. FIGS. 11A-I will be discussed with reference to forming substrate 700.

Figure 11A:
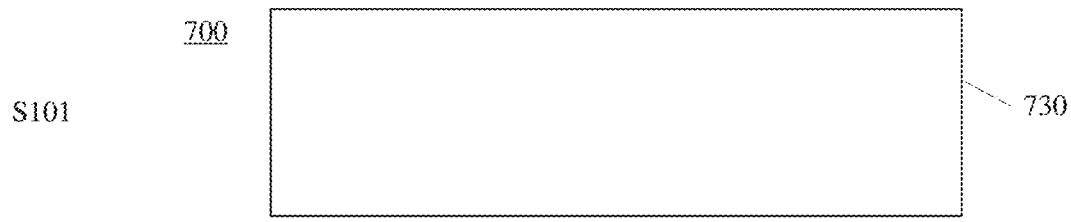
FIGS. 11A-11I illustrate steps of a method of forming a substrate, consistent with embodiments of the present disclosure.

In step S101, as shown in FIG. 11A, a blank wafer may be provided that may form the base of substrate 700. The wafer may be a p− semiconductor wafer. Step S101 may include forming semiconductor region 730. Semiconductor region 730 may be formed by virtue of a wafer possessing an intrinsic carrier concentration. The wafer may be formed front a silicon wafer having very light doping.

Figure 11B:
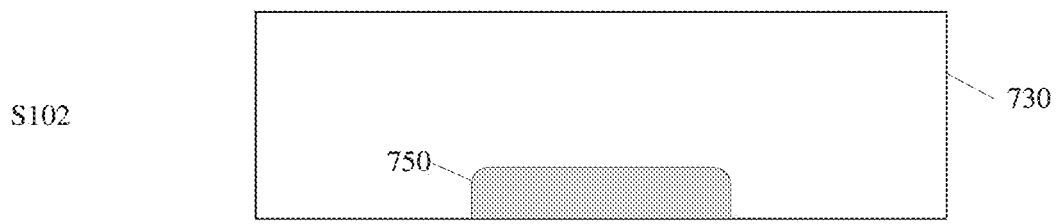

In step S102, as shown in FIG. 11B, semiconductor region 750 may be formed in substrate 700. As noted above, semiconductor region may include an n+ semiconductor. Step S102 may include semiconductor doping. In step S102, particles such as a dopant species may be implanted in substrate 700 by, for example, ion injection. Step S102 may include providing a mask on a surface of substrate 700 so that dopant species may be selectively implanted on the substrate surface. Depth of implantation may be controlled by adjusting the energy level of incident particles, for example. Semiconductor region 750 may form the collector of a gain element.

Figure 11C:
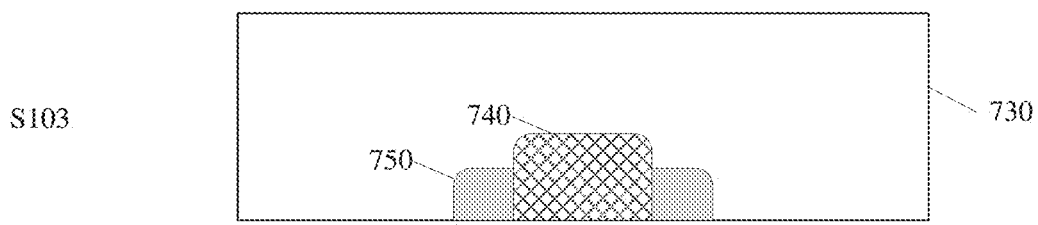

In step S103, as shown in FIG. 11C, semiconductor region 740 may be formed in substrate 700. As noted above, semiconductor region 740 may include a semiconductor. Step S103 may include semiconductor doping. Semiconductor region 740 may be formed by implanting a dopant into semiconductor region 750 to a depth greater than that of semiconductor region 750. Semiconductor region 740 may be formed to protrude from semiconductor region 740 into the intrinsic region of substrate 700, e.g., into semiconductor region 730. As a result of forming semiconductor region 740, semiconductor region 750 may surround semiconductor region 740. Semiconductor region 740 may protrude through semiconductor region 750. Semiconductor region 740 may form the base of a gain element and may form a terminal of a sensing element.

Substrate 700 including a protruding portion of semiconductor region 740 may be useful for forming a sensing element in substrate 700. Charge carriers generated due to incident charged particles on a detector including substrate 700 may travel through semiconductor region 730 and be guided to semiconductor region 740. A direct path may be formed for carriers in a depletion region of substrate 700 to travel to semiconductor region 740 in operation.

Figure 11D:
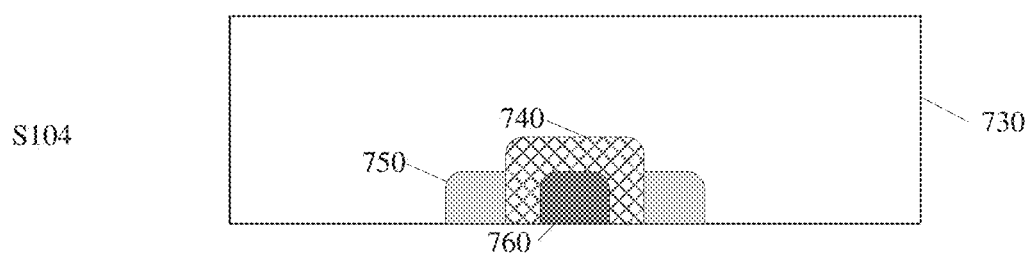

In step S104, as shown in FIG. 11D, semiconductor region 760 may be formed in substrate 700. As noted above, semiconductor region 760 may include an n+++ semiconductor. Step S104 may include semiconductor doping. Semiconductor region 760 may be formed by implanting a dopant into semiconductor region 740 to a depth less than that of semiconductor region 740. The depth of semiconductor region 760 may be the same as that of semiconductor region 750. Semiconductor region 760 may form the emitter of a gain element.

Figure 11E:
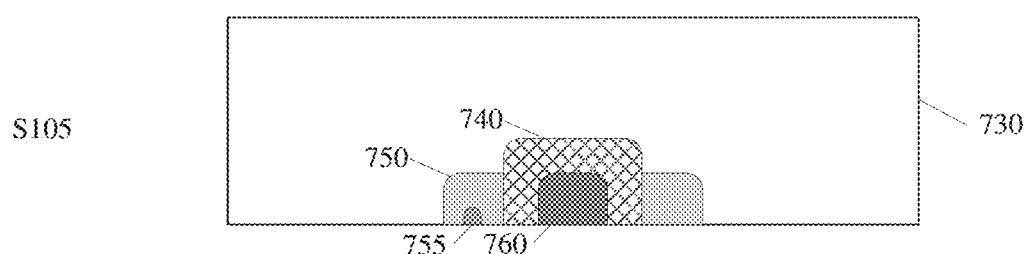

In step S105, as shown in FIG. 11E, semiconductor region 755 may be formed in substrate 700. As noted above, semiconductor region 755 may include an n++ semiconductor. Step S105 may include semiconductor doping. Semiconductor region 755 may be formed by implanting a dopant into semiconductor region 750 to a depth less than that of semiconductor region 750. Semiconductor region 755 may be formed on one side of semiconductor region 750 adjacent to semiconductor region 740. Semiconductor region 755 may form an ohmic contact with a pad in a metal layer for external connection to a collector of a gain element.

Figure 11F:
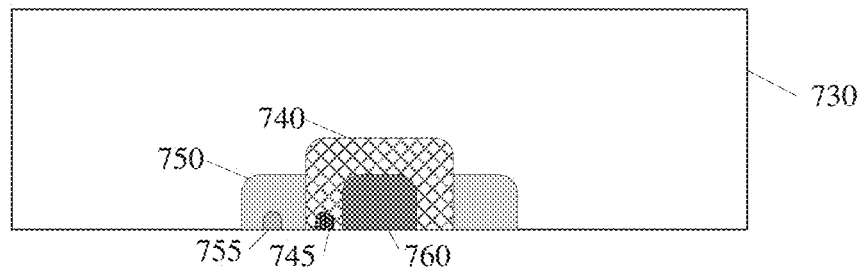

In step S106, as shown in FIG. 11F, semiconductor region 745 may be formed in substrate 700. As noted above, semiconductor region 745 may include a p++ semiconductor. Step S106 may include semiconductor doping. Semiconductor region 745 may be formed by implanting a dopant into semiconductor region 740 to a depth less than that of semiconductor region 740. Semiconductor region 745 may be formed on one side of semiconductor region 740 adjacent to semiconductor region 760. Semiconductor region 745 may form an ohmic contact with a pad in a metal layer for external connection to a base of a gain element.

Figure 11G:
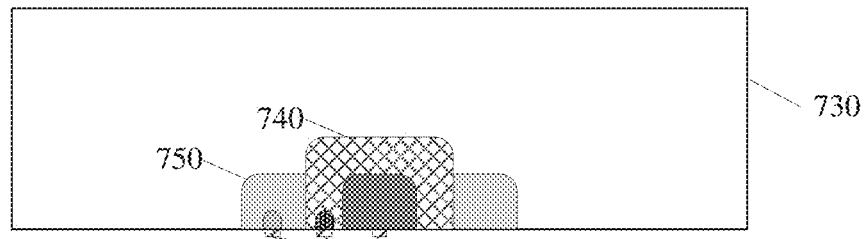

In step S107, as shown in FIG. 11G, wirings 770 may be formed on a bottom surface of substrate 700. As noted above, wirings 770 may include aluminum. A gain element may be formed in substrate 700 by the processing exemplified by steps S102-S107.

Figure 11H:
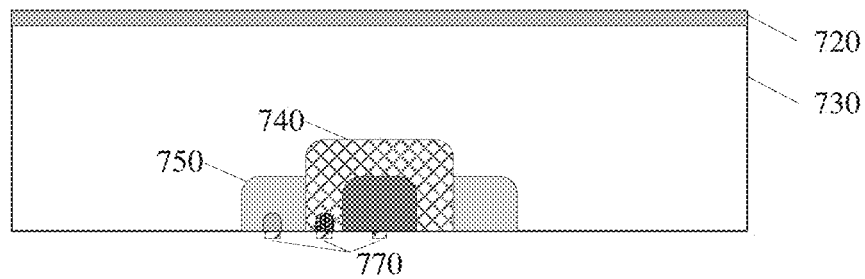

In step S108, as shown in FIG. 11H, semiconductor region 720 may be formed in substrate 700. As noted above, semiconductor region 720 may include an n++ semiconductor. Step S108 may include semiconductor doping. Semiconductor region 720 may be formed by implanting a dopant into substrate 700. Semiconductor region 720 may form a terminal of sensing element.

Beginning from step S108, processing may proceed on an opposite side of substrate 700. Thus, processing on one side of substrate 700 may be completed before processing on another side of substrate 700 begins. This may be efficient from a processing standpoint. However, in some embodiments, it may be advantageous to complete all of the semiconductor doping steps before metallization. For example, the order of steps S108 and S107 may be reversed. In some embodiments, a substrate may include deep-well features, additional contacts, or circuit elements, etc. Therefore, some embodiments may use processing where semiconductor region 720 is formed before forming wirings or metal layers.

Figure 11I:
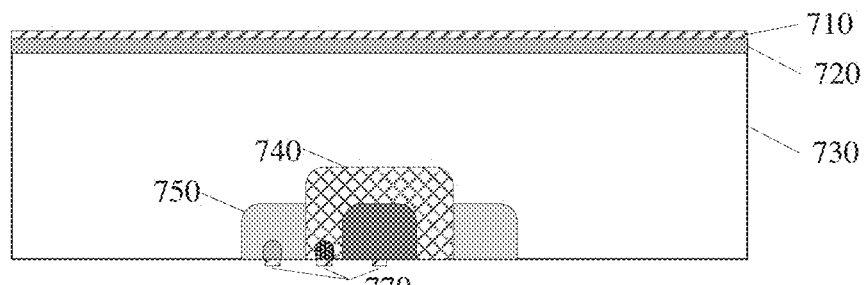

In step S109, as shown in FIG. 11I, metal layer 710 may be formed on a top surface of substrate 700. As noted above, metal layer 710 may include aluminum. Step S109 may include metal deposition. Metal layer 710 may form an electron-incident surface that may be a sensor surface of a detector. A sensing element may be formed in substrate 700 by the processing exemplified by steps S108 and S109.

Although FIGS. 11A-I may be discussed with respect to forming substrate 700, it is apparent that similar processing may be applied for forming other substrates, such as substrate 800, 900, and 1000. For example, in some embodiments, a mask may be used to form a plurality of semiconductor regions simultaneously.

In some embodiments, a BJT array may be formed by forming multiple regions in the same step. Further modifications of the steps discussed above may include forming wider or deeper semiconductor regions appropriately. For example, step S103 may be modified so that multiple semiconductor regions 740 are formed, as in the embodiments shown in FIGS. 8A and 8B. The width of semiconductor regions 740 may be made smaller so that they fit within semiconductor region 750. Alternatively, in some embodiments, step S102 may be modified so that semiconductor region 750 is formed to be wider.

In a comparative example, a BJT may be formed by subsequently implanting dopant species in a substrate such that continuous collector, base, and emitter terminals are formed. Each terminal may be formed by implanting dopants to a smaller depth than the preceding terminal. Thus, a collector may be formed that completely surrounds both the base and emitter. Furthermore, the base may completely surround the emitter. This may be done so that electrons flowing from the base have no other path but to travel to collector or base terminals. However, in some embodiments of the disclosure, a BJT may be provided with a base terminal that protrudes beyond the collector. Thus, electrons may travel between the base and other parts of the structure. For example, in some embodiments, such as that discussed above with respect to FIG. 7A, sensing element 711 may include semiconductor regions 720, 730, and 740. Gain element 721 may include semiconductor regions 740, 750, and 760. Semiconductor region 740, which may act as the base terminal of gain element 721, may protrude beyond semiconductor region 750 into semiconductor region 730. Therefore, when charge carriers flow through sensing element 711, for example in response to secondary electron arrival events on a detector, carriers may flow into semiconductor region 740.

A substrate with a sensing element and a gain element, such as substrate 700, may be manufactured using relatively straightforward processing such as that discussed above with respect to FIGS. 11A-11I. In a comparative example, in order to add high gain to a sensing element at low levels of input signal, it may be necessary to perform nonstandard semiconductor processing to form device structures such as avalanche diodes or other structures.

Reference will now be made to FIG. 12, which illustrates a schematic of forming electrical connections with substrate 700, consistent with embodiments of the disclosure. One or more circuits may be connected to substrate 700 and may be used to apply electrical signals to substrate 700. Substrate 700, including a sensing element and a gain element, may be operated in various configurations. In some embodiments, bias voltages may be applied to respective terminals of substrate 700 to achieve various functionality. Substrate 700 may be used as a detector for detecting a beam 1201 of incoming charged particles.

As shown in FIG. 12, a high voltage source VH may be connected to metal layer 710. Voltage source VH may be configured to provide reverse bias to the sensing element of substrate 700. The sensing element may include a diode, which, upon application of appropriate voltage, may operate in the reverse bias mode. Application of voltage by voltage source VH may contribute to generating a thick depletion region in substrate 700 in a region of semiconductor regions 720 and 730. As discussed above, the depletion region may function as a capture region and may allow generation of additional charges in response to a charged particle arrival event on the detector. These charges may form a detection signal of the sensing element.

Substrate 700, including a gain element, may be configured to add gain to the detection signal from the sensing element. The gain element may be a BJT and may be operated as an amplifier. Bias current may be supplied from current source Ib to semiconductor region 740, which may act as the base of a BJT. The BJT may be configured to operate in a linear amplification region with a specified current gain. The BJT may be biased by current source Ib so that current from the sensing element of substrate 700 is amplified.

The BJT may be configured to operate as a common emitter amplifier circuit. In such an amplifier circuit, current flowing out of the BJT via the emitter may be balanced with current flowing into the BJT via the base and collector. Thus, current flowing out of semiconductor region 760, which may act as the emitter of the BJT, may be balanced with current flowing into semiconductor region 740, acting as the base of the BJT (and as the anode of the sensing element), and current flowing into semiconductor region 750, acting as the collector of the BJT. A common emitter amplifier configuration may be advantageous from the perspective of providing high current and power gain.

A voltage source Vcc may provide voltage to a load RL and to the BJT. An output detection signal from substrate 700, acting as a sensing element, may be measured as voltage across load RL. Thus, output signal of a detector may be converted from a current signal to a voltage signal.

In operation, voltages applied to substrate 700 may be relatively low compared to a comparative example where gain is added by an avalanche effect. Output signal front a detector may be preliminarily boosted before being fed to an external amplifier. Instead of relying totally on amplification from an external amplifier, output from a sensing element may be directly amplified by a built-in gain element.

In some embodiments, current signals generated in response to arrival events of secondary charged particles on a detector may be amplified in an internal structure of a substrate of the detector. The substrate may have a gain element integrated together with a sensing element where the current signal is initially generated. The gain element may process the current signal and amplify it to be used as an output signal for the detector. In some embodiments, the output signal may be converted to a voltage. A low level of input voltage may be applied to the gain element to achieve sufficient boosting of the input current signal from the sensing element and obtain a measurable output signal.

In some embodiments, the gain of the gain element may be adjustable. The gain may be adjusted by adjusting voltage or current applied to the gain elements. For example, Vcc and Ib applied to substrate 700, as in FIG. 12, may be adjusted to different values. Voltage Vcc and current Ib may be adjusted so that an appropriate amount of gain is applied to corresponding input current levels, thus enabling dynamic range adjustment. The dynamic range of a detector may be extended so that a broader range of input signals may be processed. Characteristics of a gain element of a detector may be predictable. For example, a BJT may have a high degree of stability. Behavior of a BJT may be determined based on voltage or current applied to terminals of the BJT. For example, junction biases of the BJT may determine operation regions.

In embodiments where multiple gain elements are provided, corresponding connections may also be provided. For example, multiple current sources Ib may be connected to semiconductor regions 845-1, 845-2, 845-3, and 845-5, as in FIG. 8B. Wiring 870 may be configured to include appropriate connections to voltage or current supplies.

Figure 13:
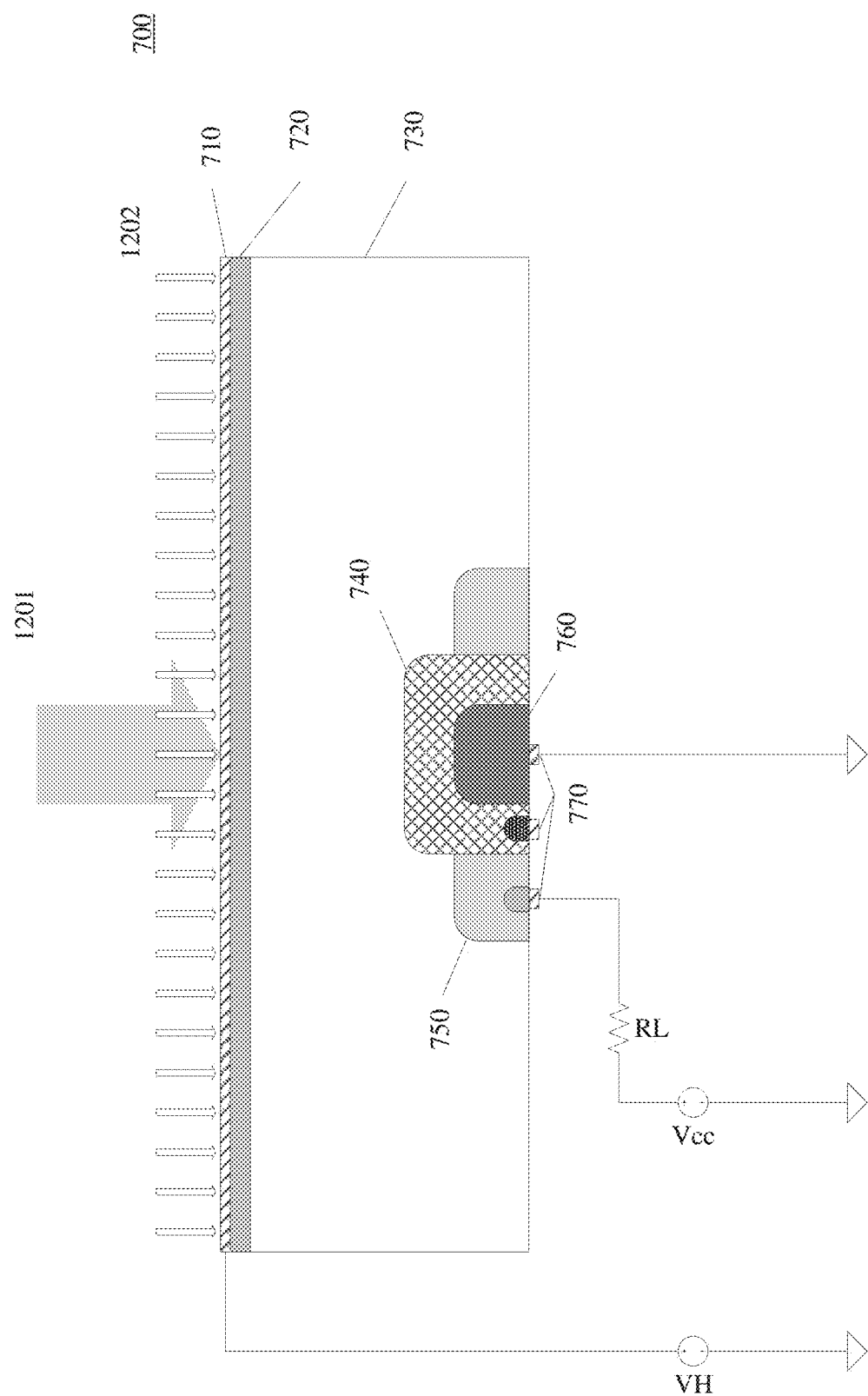
FIG. 13 illustrates another schematic of forming electrical connections with a substrate, consistent with embodiments of the present disclosure.

Reference is now made to FIG. 13, which illustrates another schematic formation of electrical connections with substrate 700, consistent with embodiments of the disclosure. Embodiments of the disclosure may include various biasing methods for a gain element of a detector. The embodiment of FIG. 13 may use a floating base.

The embodiment of FIG. 13 may be similar to that of FIG. 12, except that instead of current source Ib, semiconductor region 740 may be biased by photocurrent generated by flooding light 1202. Substrate 700 may be configured to generate current by the photoelectric effect such that electrons may be generated in response to incidence of photons. In some embodiments, a flood light may be provided that is aimed at substrate 700. Radiation provided by flooding light 1202 may be used to bias the gain element of substrate 700 so that a BJT operates in a linear amplification region.

In some embodiments, a bias circuit directly connected to semiconductor region 740 may be omitted. That is, the need to provide a separate circuit to supply electrical current used for biasing the base of the BJT may be eliminated. Some embodiments may omit a current source and may reduce noise that may be introduced through a bias circuit including the current source. Furthermore, some embodiments may be configured to have a simpler grounding design of substrate 700.

Embodiments of the disclosure may be particularly effective in applications where the energy of incident electrons on a detector is relatively low. Such situations may be encountered in certain applications, such as when beam current of a primary electron beam of a SEM is low even when incoming electron energy may be high, when beam current is not low but incoming electron energy is low, or when beam current is low and incoming electron energy is low. Furthermore, in some embodiments, charged particle counting may be used in a detector.

Counting charged particles, such as electrons may have numerous advantages as compared to detecting an analog signal. Counting electrons may be particularly effective in some types of applications, such as CD SEM, high-resolution high-throughput inspection, or metrology of manufactured semiconductor devices. In some embodiments discussed herein, a detection system may enable electron counting for electron beams of, for example, 100 μA or lower, while providing gain sufficient to measure signals generated in a detector.

The embodiments may further be described using the following clauses:

1. A detector for a charged particle beam apparatus, the detector comprising:
   a sensing element; and
   a gain element, wherein
   the sensing element and the gain element are aligned in a first direction, and
   the gain element includes a section in which, along a second direction perpendicular to the first direction, a region of first conductivity is provided adjacent to a region of second conductivity, and a region of third conductivity is provided adjacent to the region of second conductivity, the region of second conductivity being interposed between the region of first conductivity and the region of third conductivity.

2. The detector of clause 1, wherein the sensing element comprises a first layer including a region of fourth conductivity.

3. The detector of clause 2, wherein the sensing element includes a section in which, along the first direction, the region of fourth conductivity is provided adjacent to an intrinsic region, and the region of second conductivity is provided adjacent to the intrinsic region.

4. The detector of clause 3, wherein the region of second conductivity protrudes beyond the region of first conductivity and into the intrinsic region.

5. The detector of any one of the preceding clauses, wherein the region of third conductivity is of the same conductivity type as the first conductivity and is more conductive than the region of first conductivity.

6. The detector of any one of the preceding clauses, wherein
   the region of first conductivity is an n+ semiconductor,
   the region of second conductivity a p+ semiconductor, and
   the region of third conductivity is an n+++ semiconductor.

7. The detector of any one of clauses 1-5, wherein
   the region of first conductivity is a p+ semiconductor,
   the region of second conductivity an n+ semiconductor, and
   the region of third conductivity is a p+++ semiconductor.

8. The detector of any one of the preceding clauses, wherein the gain element is a bipolar junction transistor.

9. The detector of any one of clauses 2-4, wherein the region of fourth conductivity is of the same conductivity type as the first conductivity and is more conductive than the region of first conductivity and is less conductive than the region of third conductivity.

10. The detector of any one of clauses 2-4 or 9, wherein the region of fourth conductivity is an n++ semiconductor.

11. The detector of any one of clauses 2-4 or 9, wherein the region of fourth conductivity is a p++ semiconductor.

12. The detector of any one of the preceding clauses, wherein the gain element is one of a plurality of gain elements included in the detector.

13. A substrate comprising:
   a first layer including a first region of a first conductivity;
   a second layer including a second region of a second conductivity;
   a third layer including a third region of a third conductivity interposed between a fourth region of the second conductivity; and
   a fourth layer including a fifth region of a fourth conductivity type interposed between a sixth region of the third conductivity, the sixth region being interposed between a seventh region of a fifth conductivity, the seventh region being interposed between an eighth region of the second conductivity,
   wherein the first through fourth layers are stacked in a thickness direction of the substrate.

14. The substrate of clause 13, further comprising a ninth region of a sixth conductivity embedded in the sixth region, and a tenth region of a seventh conductivity embedded in the seventh region.

15. The substrate of clause 14 wherein
   the first conductivity is an n++ semiconductor,
   the second conductivity is a p– semiconductor,
   the third conductivity is a p+ semiconductor,
   the fourth conductivity is an n+++ semiconductor,
   the fifth conductivity is an n+ semiconductor,
   the sixth conductivity is a p++ semiconductor, and
   the seventh conductivity is an n++ semiconductor.

16. The substrate of clause 14 wherein
   the first conductivity is a p++ semiconductor,
   the second conductivity is an n– semiconductor,
   the third conductivity is an n+ semiconductor,
   the fourth conductivity is a p+++ semiconductor,
   the fifth conductivity is a p+ semiconductor,
   the sixth conductivity is an n++ semiconductor, and
   the seventh conductivity is a p++ semiconductor.

17. The substrate of any one of clauses 13-16, further comprising a first metal layer adjacent to the first layer and a second metal layer adjacent to the fourth layer, the first and second metal layers including contacts for connecting terminals of sensing elements or gain elements to an electrical circuit.

18. The substrate of any one of clauses 13-17, wherein the second region is continuous with the fourth region, and the fourth region is continuous with the eighth region.

19. The substrate of any one of clauses 13-18, wherein the third region is continuous with the sixth region.

20. The substrate of any one of clauses 13-19, wherein a sensing element and a gain element are integrated in the substrate and include a common terminal, the sensing element including the first region, the second region, the third region, the fourth region, and the eighth region, and the gain element including the third region, the fifth region, the sixth region, and the seventh region.

21. The substrate of clause 17, further comprising a circuit connected to the substrate, wherein the circuit is electrically connected to the first metal layer and the second metal layer.

22. A detector comprising the substrate of any one of clauses 13-21, wherein charged particles incident on the detector are secondary particles resulting from interaction of primary particles with a specimen or scattered primary particles, the primary particles being generated from a source of the charged particle beam apparatus and focused on the specimen.

23. A method comprising:
forming a sensing element in a substrate; and
forming a gain element in the substrate,
wherein
the sensing element and the gain element are aligned in a first direction, and
the gain element includes a section in which, along a second direction perpendicular to the first direction, a region of first conductivity is provided adjacent to a region of second conductivity, and a region of third conductivity is provided adjacent to the region of second conductivity, the region of second conductivity being interposed between the region of first conductivity and the region of third conductivity.

24. The method of clause 23, wherein forming the sensing element and forming the gain element comprises semiconductor doping.

25. The method of clause 23 or clause 24, wherein forming the gain element comprises:
implanting the region of second conductivity into the region of first conductivity to a depth greater than a depth of the region of first conductivity.

26. The method of any one of clauses 23-25, wherein the sensing element comprises a first layer including a region of fourth conductivity.

27. The method of clause 26, wherein the sensing element includes a section in which, along the first direction, the region of fourth conductivity is provided adjacent to an intrinsic region, and the region of second conductivity is provided adjacent to the intrinsic region.

28. The method of clause 27, wherein the region of second conductivity protrudes beyond the region of first conductivity and into the intrinsic region.

29. The method of any one of the clauses 23-28, wherein the region of third conductivity is of the same conductivity type as the first conductivity and is more conductive than the region of first conductivity.

30. The method of any one of clauses 23-29, wherein
the region of first conductivity is an n+ semiconductor,
the region of second conductivity a p+ semiconductor, and
the region of third conductivity is an n+++ semiconductor.

31. The method of any one of clauses 23-29, wherein
the region of first conductivity is a p+ semiconductor,
the region of second conductivity an n+ semiconductor, and
the region of third conductivity is a p+++ semiconductor.

32. The method of any one of clauses 23-31, wherein the gain element is a bipolar junction transistor.

33. The method of any one of clauses 26-28, wherein the region of fourth conductivity is of the same conductivity type as the first conductivity and is more conductive than the region of first conductivity and is less conductive than the region of third conductivity.

34. The method of any one of clauses 26-28 or 33, wherein the region of fourth conductivity is an n++ semiconductor.

35. The method of any one of clauses 26-28 or 33, wherein the region of fourth conductivity is a p++ semiconductor.

36. The method of any one of the clauses 23-35, wherein the gain element is one of a plurality of gain elements included in the substrate.

37. The substrate of clause 14, wherein a sensing element and a gain element are integrated in the substrate and include a common terminal, the sensing element including the first region, the second region, the third region, the fourth region, and the eighth region, and the gain element including the third region, the fifth region, the sixth region, the seventh region, the ninth region, and the tenth region.

In some embodiments, a detector may communicate with a controller that controls a charged particle beam system. The controller may instruct components of the charged particle beam system to perform various functions, such as controlling a charged particle source to generate a charged particle beam and controlling a deflector to scan the charged particle beam. The controller may also perform various other functions such as adjusting operating conditions of a sensing element or a gain element of a detector. The controller may be configured to adjust bias applied to the gain element. The controller may be configured to adjust the dynamic range of a detector in real time. The controller may comprise a storage that is a storage medium such as a hard disk, random access memory (RAM), other types of computer readable memory, and the like. The storage may be used for storing output signals from the detector and may save scanned raw image data as original images, and post-processed images. A non-transitory computer readable medium may be provided that stores instructions for a processor of controller 109 to carry out charged particle beam detection, gain adjustment, image processing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

It will be appreciated that the embodiments of the present disclosure are not limited to the exact construction that has been described above and illustrated in the accompanying drawings, and that various modifications and changes can be made without departing from the scope thereof. For example, while a PIN diode has been discussed with reference to certain exemplary embodiments, other types of diodes, such as a NIP diode may be similarly applied. Furthermore, other types of devices that may generate a measurable signal in response to receiving incident energy may be applied in a detector. The present disclosure is not limited to electrons and may be applicable to applications for detecting other types of radiation.

The invention claimed is:

1. A detector for a charged particle beam apparatus, the detector comprising:
a sensing element; and
a gain element, wherein
the gain element includes a section in which, along a second direction perpendicular to a first direction, a region of first conductivity is provided adjacent to a region of second conductivity, and a region of third conductivity is provided adjacent to the region of second conductivity, the region of second conductivity being interposed between the region of first conductivity and the region of third conductivity;
the sensing element comprises a first layer including a region of fourth conductivity;
the sensing element and the gain element are aligned in the first direction such that a virtual line extending in the first direction passes through the first layer and one of the region of first conductivity, the region of second conductivity, or the region of third conductivity; and
the sensing element includes a section in which, along the first direction, the region of fourth conductivity is provided adjacent to an intrinsic region, and the region of second conductivity is provided adjacent to the intrinsic region.

2. The detector of claim 1, wherein the region of second conductivity protrudes beyond the region of first conductivity and into the intrinsic region.

3. The detector of claim 1, wherein the region of third conductivity is of the same conductivity type as the first conductivity and is more conductive than the region of first conductivity.

4. The detector of claim 3, wherein
the region of first conductivity is an n-type semiconductor,
the region of second conductivity a p-type semiconductor, and
the region of third conductivity is an n-type semiconductor.

5. The detector of claim 3, wherein
the region of first conductivity is a p-type semiconductor,
the region of second conductivity an n-type semiconductor, and
the region of third conductivity is a p-type semiconductor.

6. The detector of claim 1, wherein the gain element is a bipolar junction transistor.

7. The detector of claim 1, wherein the region of fourth conductivity is of the same conductivity type as the first conductivity and is more conductive than the region of first conductivity and is less conductive than the region of third conductivity.

8. The detector of claim 7, wherein the region of fourth conductivity is an n-type semiconductor.

9. The detector of claim 7, wherein the region of fourth conductivity is a p-type semiconductor.

10. The detector of claim 1, wherein the gain element is one of a plurality of gain elements included in the detector.

11. A method comprising:
forming a sensing element in a substrate; and
forming a gain element in the substrate,
wherein
the gain element includes a section in which, along a second direction perpendicular to a first direction, a region of first conductivity is provided adjacent to a region of second conductivity, and a region of third conductivity is provided adjacent to the region of second conductivity, the region of second conductivity being interposed between the region of first conductivity and the region of third conductivity;
the sensing element comprises a first layer including a region of fourth conductivity;
the sensing element and the gain element are aligned in the first direction such that a virtual line extending in the first direction passes through the first layer and one of the region of first conductivity, the region of second conductivity, or the region of third conductivity; and
the sensing element includes a section in which, along the first direction, the region of fourth conductivity is provided adjacent to an intrinsic region, and the region of second conductivity is provided adjacent to the intrinsic region.

12. The method of claim 11, wherein forming the sensing element and forming the gain element comprises semiconductor doping.

13. The method of claim 11, wherein forming the gain element comprises:
implanting the region of second conductivity into the region of first conductivity to a depth greater than a depth of the region of first conductivity.

14. The detector of claim 1, the sensing element comprises the region of second conductivity.

15. A detector for a charged particle beam apparatus, the detector comprising:
a sensing element; and
a gain element, wherein
the sensing element and the gain element are aligned in a first direction such that a virtual line in the first direction passes through the sensing element and the gain element,
the gain element comprises:
a region of first conductivity, a region of second conductivity, and a region of third conductivity;
the sensing element comprises the region of second conductivity,
wherein along a second direction perpendicular to the first direction, the region of first conductivity is provided adjacent to the region of second conductivity, the region of third conductivity is provided adjacent to the region of second conductivity, and the region of second conductivity is interposed between the region of first conductivity and the region of third conductivity.

* * * * *